(12) United States Patent
Lee et al.

(10) Patent No.: US 12,236,047 B2
(45) Date of Patent: Feb. 25, 2025

(54) TOUCH DISPLAY DEVICE

(71) Applicant: LG Display Co., Ltd., Seoul (KR)

(72) Inventors: HwiDeuk Lee, Gumi-si (KR); JuHong Kim, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/499,788

(22) Filed: Nov. 1, 2023

(65) Prior Publication Data
US 2024/0160323 A1 May 16, 2024

(30) Foreign Application Priority Data
Nov. 10, 2022 (KR) .................. 10-2022-0149786

(51) Int. Cl.
*G06F 3/044* (2006.01)
*G09G 3/3233* (2016.01)
*H10K 59/40* (2023.01)

(52) U.S. Cl.
CPC .......... *G06F 3/044* (2013.01); *G09G 3/3233* (2013.01); *H10K 59/40* (2023.02); *G06F 2203/04111* (2013.01); *G09G 2300/0413* (2013.01); *G09G 2300/0842* (2013.01); *G09G 2354/00* (2013.01)

(58) Field of Classification Search
CPC .......... G06F 3/044; G06F 2203/04111; G06F 2203/04112; G06F 3/0412; G06F 3/04164; G06F 3/0443; G06F 3/0446; G06F 3/046; G09G 3/3233; G09G 2300/0413; G09G 2354/00; G09G 2300/0842; H10K 59/40
See application file for complete search history.

(56) References Cited

U.S. PATENT DOCUMENTS

| | | | |
|---|---|---|---|
| 2008/0062140 A1* | 3/2008 | Hotelling | G06F 3/0444 345/173 |
| 2013/0278513 A1* | 10/2013 | Jang | G06F 3/0445 345/173 |
| 2013/0342770 A1* | 12/2013 | Kim | G06F 3/0443 349/12 |
| 2015/0153858 A1* | 6/2015 | Kim | G06F 3/04166 345/173 |
| 2020/0026383 A1* | 1/2020 | Hwang | G06F 3/04184 |
| 2021/0026514 A1* | 1/2021 | Lee | G06F 3/0446 |
| 2021/0124448 A1* | 4/2021 | Lee | G06F 3/0412 |
| 2021/0141479 A1* | 5/2021 | Lee | H10K 59/126 |
| 2021/0173543 A1* | 6/2021 | Lee | G06F 3/0412 |

* cited by examiner

*Primary Examiner* — Benyam Ketema
(74) *Attorney, Agent, or Firm* — Fenwick & West LLP

(57) ABSTRACT

The present disclosure relates to a touch display device including a substrate, a pixel area in which at least one subpixel is disposed, a first touch sensor area located on a first side of the pixel area, a second touch sensor area located on a second opposing side of the pixel area, at least one pixel electrode disposed in the pixel area, a first electrode disposed in the first touch sensor area, and a second electrode disposed in the second touch sensor area. As the first electrode and the second electrode include a metal included in the at least one pixel electrode, the touch display device can provide an effect of reducing the thickness of a display panel even though a touch sensor is embedded in the display panel.

24 Claims, 18 Drawing Sheets

TOUCH DISPLAY DEVICE

CROSS-REFERENCE TO RELATED APPLICATION

This application claims the priority benefit of Republic of Korea Patent Application No. 10-2022-0149786, filed on Nov. 10, 2022 in the Korean Intellectual Property Office, which is incorporated herein by reference in its entirety.

BACKGROUND

Technical Field

The present disclosure relates to electronic devices with a display, and more specifically, to touch display devices.

Description of the Related Art

In today's society, display devices are widely used and increasingly important for presenting visual information to users. As the necessity of providing a user-friendly environment increases, various functions are integrated into the display devices, and many of today's display devices tend to employ a touch-enabled input interface capable of receiving a touch-based input. Such touch display devices with the touch-enabled input interface allow users to input information or commands more intuitively and conveniently, compared with typical input devices, such as buttons, keyboards, mice, and the like.

In order to provide such a touch-based input function, the touch display device is needed to include a touch sensor structure and a touch circuit for sensing a touch. The touch sensor structure of the touch display device typically includes a plurality of touch electrodes and a plurality of touch lines for electrically connecting the touch electrodes to the touch circuit, and the touch sensing circuit is required to normally perform an intended operation in the touch sensor structure.

These days, in order to reduce the thickness of the touch display device and improve image quality, work is progressing on developing a touch display device having a touch sensor including a plurality of touch electrodes integrated into a display panel. As display technology advances, there is an increasingly need for a touch display device including a display panel in which light emitting elements with self-emissive capability are disposed, for example, as an organic light emitting diode (OLED) display. In addition, there is also an increasingly need for a touch display device enabling touch sensing and allowing light to pass through the front and back of the display device.

SUMMARY

In the touch and display technology field, touch display devices in which a touch sensor is embedded in a display panel have been developed to reduce the thickness of the touch display devices and improve image quality. However, when such typical touch display devices, in which a touch sensor is embedded, are self-emissive display devices in which self-emissive light emitting elements are disposed in the display panel, such as organic light emitting diode (OLED) displays, one or more additional layers can be needed for the touch sensor embedded in the display devices. Indeed, this can cause the manufacturing process to become more complicate and the display panel to become thicker. In addition, in the case of a display panel having a light transmissive structure while allowing a touch sensor to be embedded, there are considerable difficulties in designing and manufacturing the display panel.

To address these issues, one or more embodiments of the present disclosure may provide a touch display deice including a display panel allowing a touch sensor to be embedded while having a thin thickness.

One or more embodiments of the present disclosure may provide a touch display deice having a structure in which a touch sensor is configured using a layer or material related to image displaying.

One or more embodiments of the present disclosure may provide a touch display deice having a structure allowing a touch sensor to be embedded and light to be transmitted.

According to aspects of the present disclosure, a touch display device can be provided that includes a substrate, a pixel area in which at least one subpixel is disposed, a first touch sensor area located on a first side of the pixel area, a second touch sensor area located on a second opposing side of the pixel area, and at least one pixel electrode disposed in the pixel area and including a first metal.

In one or more embodiments, the touch display device may include a first electrode disposed in the first touch sensor area and including the first metal, and a second electrode disposed in the second touch sensor area and including the first metal.

In one or more embodiments, the touch display device may further include a bridge electrically interconnecting the first electrode and the second electrode.

In one or more embodiments, in the touch display device, the first touch sensor area and the second touch sensor area may be areas through which light can be transmitted.

The bridge may include a first connector electrically connected to the first electrode and a second connector electrically connected to the second electrode.

The first connector may be located under the first electrode. The first connector may directly contact the rear surface of the first electrode.

The second connector may be located under the second electrode. The second connector may directly contact the rear surface of the second electrode.

In one or more embodiments, the touch display device may further include a lower insulating layer on a substrate, an overcoat layer located between the lower insulating layer and at least one pixel electrode in the pixel area, an organic layer disposed in the pixel area and located on the at least one pixel electrode, a first dummy organic layer disposed in the first touch sensor area and located on the first electrode, a second dummy organic layer disposed in the second touch sensor area and located on the second electrode, a common electrode on the organic layer, a first dummy common electrode on the first dummy organic layer, and a second dummy common electrode disposed in the second touch sensor area.

The common electrode and the first dummy common electrode may be spaced apart and electrically separated from each other, and the common electrode and the second dummy common electrode may be spaced apart and electrically separated from each other.

The lower insulating layer may include a first depression recessed inwardly at a boundary between the pixel area and the first touch sensor area, and a second depression recessed inwardly at a boundary between the pixel area and the second touch sensor area.

At a point where the first depression is located, the common electrode and the first dummy common electrode may be spaced apart and electrically separated from each other. At a point where the second depression is located, the common electrode and the second dummy common electrode may be spaced apart and electrically separated from each other.

A display common voltage may be applied to the common electrode, and the first dummy common electrode and the second dummy common electrode may be in an electrically floating state.

In one or more embodiments, the touch display device may include a first touch electrode and a first touch line electrically connected to each other.

The first touch electrode may include two or more electrodes electrically connected to each other, and the two or more electrodes may include the first electrode and the second electrode electrically connected by the bridge.

The touch line may be electrically connected to at least one of the first electrode, the second electrode, and the bridge.

According to aspects of the present disclosure, a touch display device can be provided that includes a substrate, a pixel area in which at least one subpixel is disposed, a first touch sensor area located on one side of the pixel area, at least one pixel electrode disposed in the pixel area, a first electrode disposed in the first touch sensor area, an organic layer disposed in the pixel area and located on the at least one pixel electrode, a first dummy organic layer disposed in the first touch sensor area and located on the first electrode, a common electrode disposed in the pixel area and located on the organic layer, and a first dummy common electrode disposed in the first touch sensor area, located on the first dummy organic layer, and being in an electrically floating state.

In one or more embodiments, in the touch display device, the first electrode may include a metal included in at least one pixel electrode.

According to one or more embodiments of the present disclosure, a touch display device may be provided that even when a touch sensor is embedded in a display panel, enables the thickness of the display panel to be reduced, and thereby, allows the weight of the display panel to be reduced.

According to one or more embodiments of the present disclosure, a touch display device may be provided that includes a structure in which a touch sensor is configured using a layer or material related to image displaying without a separate process for forming the touch sensor, and thereby, helps realize low manufacturing production energy and an optimized process (or optimized manufacturing process through such a simplified process.

According to one or more embodiments of the present disclosure, a touch display device may be provided that has a structure allowing a touch sensor to be embedded and light to be transmitted.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure.

In the drawings.

DETAILED DESCRIPTION

Figure 1:
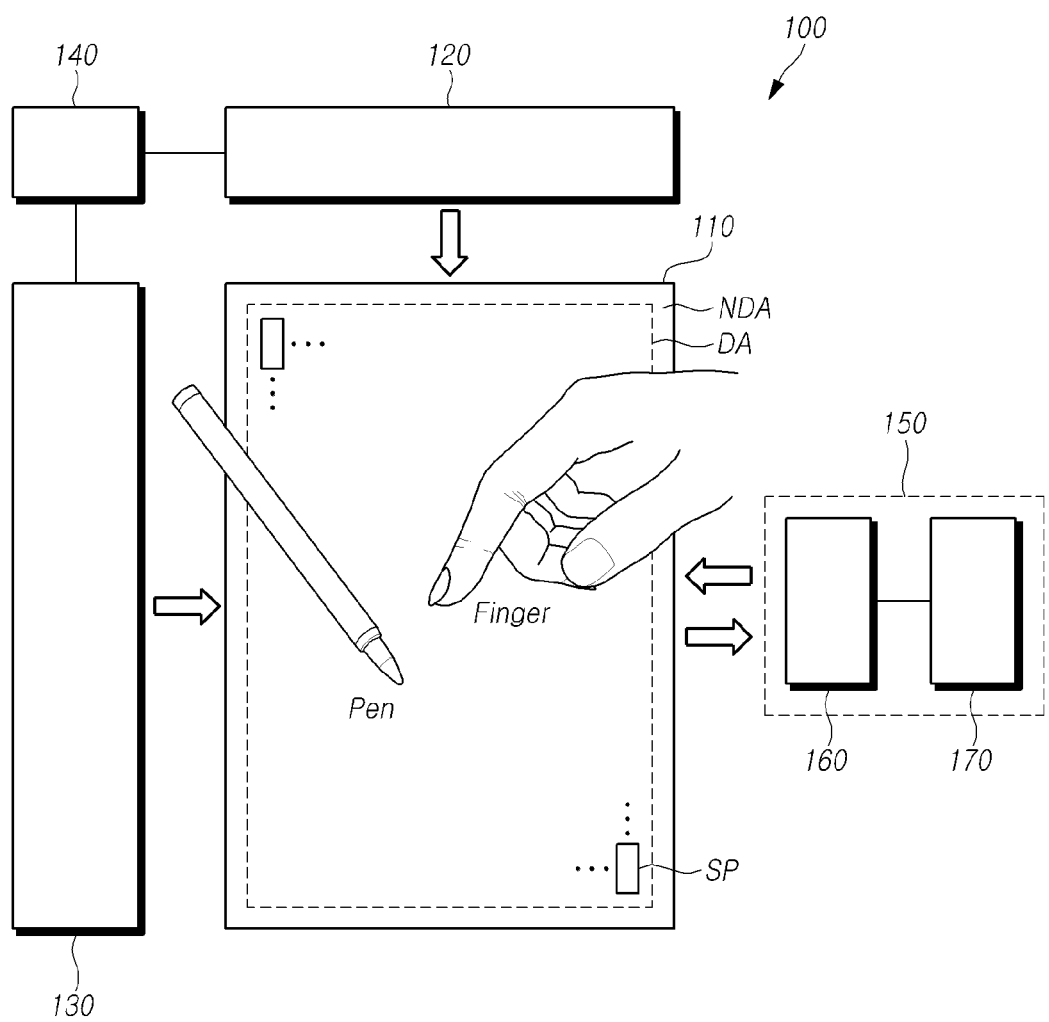
FIG. 1 illustrates an example system configuration of a touch display device according to embodiments of the present disclosure.

Reference will now be made in detail to embodiments of the present disclosure, examples of which may be illustrated in the accompanying drawings.

In the following description, the structures, embodiments, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents. In the following description, where the detailed description of the relevant known function or configuration may unnecessarily obscure aspects of the present disclosure, a detailed description of such known function or configuration may be omitted. The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom," "downward," "upward," "upper," "lower," and the like refer to an arbitrary frame of reference.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, with reference to the accompanying drawings, various embodiments of the present disclosure will be described in detail.

FIG. 1 illustrates an example system configuration of a touch display device 100 according to embodiments of the present disclosure.

Referring to FIG. 1, the touch display device 100 may include a display panel 110 and a display driving circuit as components for displaying an image.

The display driving circuit may be a circuit for driving the display panel 110, and include a data driving circuit 120, a gate driving circuit 130, a display controller 140, and other circuit components.

The display panel 110 may include a display area DA in which one or more images can be displayed and a non-display area NDA in which an image is not displayed. The non-display area NDA may be an area outside of the display area DA, and may also be referred to as an edge area or a bezel area.

The display panel 110 may include a plurality of subpixels SP. The display panel 110 may include further include various types of signal lines to drive the plurality of subpixels SP.

Such various types of signal lines may include a plurality of data lines for transmitting data signals (also referred to as data voltages or image signals) and a plurality of gate lines for delivering gate signals (also referred to as scan signals). The plurality of data lines and the plurality of gate lines may intersect each other. Each of the plurality of data lines may be disposed such that it extends in a first direction. Each of the plurality of gate lines may be disposed such that it extends in a second direction different from the first direction. For example, the first direction may be a column or vertical direction, and the second direction may be a row or horizontal direction. In another example, the first direction may be the row or horizontal direction, and the second direction may be the column or vertical direction.

In one or more aspects, the touch display device 100 may be a liquid crystal display device in which the display panel 110 does not have a self-emissive capability, and instead, requires a backlight unit for illumination, or be a self-emissive display device in which the display panel 110 has a self-emissive capability. In embodiments where the touch display device 100 according to aspects of the present disclosure is a self-emissive display device, each of the plurality of subpixels SP may include a light emitting element. Hereinafter, discussions are provided based on embodiments where the touch display device 100 according to aspects of the present disclosure is a self-emissive display device.

In one embodiment, when the touch display device 100 according to aspects of the present disclosure is a self-emissive display device, the display device 100 may be an organic light emitting display device implemented using organic light emitting diodes (OLED) as light emitting elements. In another embodiment, the touch display device 100 according to aspects of the present disclosure may be an inorganic light emitting display device implemented using light emitting diodes based on inorganic material as light emitting elements. In further another embodiment, the touch display device 100 according to aspects of the present disclosure may be a quantum dot display device implemented using quantum dots as light emitting elements, which are self-emissive semiconductor crystals.

The structure of each of the plurality of subpixels SP may vary according to types of the touch display device 100. For example, when the touch display device 100 is a self-emissive display device including self-emissive subpixels SP, each subpixel SP may include a self-emissive light emitting element, one or more transistors, and one or more capacitors.

The data driving circuit 120 may be a circuit for driving a plurality of data lines, and can output data signals to the plurality of data lines. The gate driving circuit 130 may be a circuit for driving a plurality of gate lines, and can output gate signals to the plurality of gate lines. The display controller 140 may be a device for controlling the data driving circuit 120 and the gate driving circuit 130, and can control driving timings for the plurality of data lines and driving timings for the plurality of gate lines.

The display controller 140 can supply at least one data driving control signal to the data driving circuit 120 to control the data driving circuit 120, and supply at least one gate driving control signal to the gate driving circuit 130 to control the gate driving circuit 130.

The data driving circuit 120 can supply data signals to the plurality of data lines according to the driving timing control of the display controller 140. The data driving circuit 120 can receive digital image data from the display controller 140, convert the received image data into analog data signals, and output the resulting analog data signals to the plurality of data lines.

The gate driving circuit 130 can supply gate signals to the plurality of gate lines GL according to the timing control of the display controller 140. The gate driving circuit 130 can receive a first gate voltage corresponding to a turn-on level voltage and a second gate voltage corresponding to a turn-off level voltage along with several types of gate driving control signals (e.g., a start signal, a reset signal, and the like), generate gate signals, and supply the generated gate signals to the plurality of gate lines.

In one or more embodiments, the data driving circuit 120 may be connected to the display panel 110 using a tape-automated-bonding (TAB) technique, or connected to a conductive pad such as a bonding pad of the display panel 110 using a chip-on-glass (COG) technique or a chip-on-panel (COP) technique, or connected to the display panel 110 using a chip-on-film (COF) technique.

For example, the gate driving circuit 130 may be connected to the display panel 110 using the tape-automated-bonding (TAB) technique, or connected to a conductive pad such as a bonding pad of the display panel 110 using the chip-on-glass (COG) technique or the chip-on-panel (COP) technique, or connected to the display panel 110 using the chip-on-film (COF) technique. In one or more embodiments, the gate driving circuit 130 may be disposed in the non-display area NDA of the display panel 110 using a gate-in-panel (GIP) technique. The gate driving circuit 130 may be disposed on the substrate, or connected to the substrate. For example, in the case of the gate in panel (GIP) type, the gate driving circuit 130 may be disposed in the non-display area NDA of the substrate. The gate driving circuit 130 may be connected to the substrate SUB in an example where the gate driving circuit 230 is implemented with the chip-on-glass (COG) technique, the chip-on-film (COF) technique, or the like.

In one or more embodiments, at least one of the data driving circuit 120 and the gate driving circuit 130 may be disposed in the display area DA of the display panel 110. In this example, at least one of the data driving circuit 120 and the gate driving circuit 130 may be disposed not to overlap subpixels SP, or disposed to overlap one or more, or all, of the subpixels SP.

The data driving circuit 120 may be located in, and/or electrically connected to, but not limited to, only one side or portion (e.g., an upper edge or a lower edge) of the display panel 110. In one or more embodiments, the data driving circuit 120 may be located in, and/or electrically connected to, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 130 may be located in, and/or electrically connected to, but not limited to, only one side or portion (e.g., a left edge or a right edge) of the display panel 110. In one or more embodiments, the gate driving circuit 130 may be located in, and/or electrically connected to, but not limited to, two sides or portions (e.g., a left edge and a right edge) of the panel 110 or at least two of four sides or portions (e.g., an upper edge, a lower edge, the left edge, and the right edge) of the panel 110 according to driving schemes, panel design schemes, or the like.

The display controller 140 may be implemented in a separate component from the data driving circuit 120, or incorporated in the data driving circuit 120 and thus implemented in an integrated circuit.

The display controller 140 may be a timing controller used in the typical display technology or a controller or a control device capable of performing other control functions in addition to the function of the typical timing controller. In one or more embodiments, the display controller 140 may be a controller or a control device different from the timing controller, or a circuitry or a component included in the controller or the control device. The display controller 140 may be implemented with various circuits or electronic components such as an integrated circuit (IC), a field programmable gate array (FPGA), an application specific integrated circuit (ASIC), a processor, and/or the like.

The display controller 140 may be mounted on a printed circuit board, a flexible printed circuit, and/or the like and be electrically connected to the gate driving circuit 120 and the data driving circuit 130 through the printed circuit board, flexible printed circuit, and/or the like.

The display controller 140 can transmit signals to, and receive signals from, the data driving circuit 120 via one or more predefined interfaces. For example, such interfaces may include, a low voltage differential signaling (LVDS) interface, an embedded clock point-point interface (EPI), a serial peripheral interface (SPI), and the like.

In one or more embodiments, in order to further provide a touch sensing function as well as an image display function, the touch display device 100 according to aspects of the present disclosure may include a touch sensor, and a touch sensing circuit 150 configured to sense the touch sensor, and detect whether a touch has occurred by a touch object, such as a finger, a pen, or the like, or detect a touch location.

The touch sensing circuit 150 may include a touch driving circuit 160 configured to generate and provide touch sensing data by driving and sensing the touch sensor, a touch controller 170 configured to detect the occurrence of a touch or detect a touch location using the touch sensing data, and the like.

The touch sensor may include a plurality of touch electrodes. The touch sensor may further include a plurality of touch lines for electrically connecting the plurality of touch electrodes to the touch driving circuit 160. The touch sensor is sometimes referred to as a touch panel.

In one embodiment, the touch sensor included in the touch display device 100 may be located inside of the display panel 110. In this embodiment, the touch sensor is sometimes referred to as an embedded-type touch sensor or an in-cell touch sensor. During the process of manufacturing the display panel 110, the embedded-type touch sensor may be formed together with electrodes or signal lines related to the display driving.

The touch driving circuit 160 can supply a touch driving signal to at least one of the plurality of touch electrodes included in the touch sensor, and generate touch sensing data by sensing at least one of the plurality of touch electrodes.

The touch sensing circuit 150 can perform touch sensing using a self-capacitance sensing technique, and/or a mutual-capacitance sensing technique.

When the touch sensing circuit 150 performs touch sensing using the self-capacitance sensing technique, the touch sensing circuit 150 can perform touch sensing based on capacitance between each touch electrode and a touch object (e.g., a finger, a pen, etc.). According to the self-capacitance sensing technique, each of the plurality of touch electrodes can serve as both a driving touch electrode and a sensing touch electrode. The touch driving circuit 160 can drive all, or one or some, of the plurality of touch electrodes and sense all, or one or some, of the plurality of touch electrodes.

When the touch sensing circuit 150 performs touch sensing using the mutual-capacitance sensing technique, the touch sensing circuit 150 can perform touch sensing based on capacitance between touch electrodes. According to the mutual-capacitance sensing technique, the plurality of touch electrodes are divided into driving touch electrodes and sensing touch electrodes. The touch driving circuit 160 can drive the driving touch electrodes and sense the sensing touch electrodes.

As described above, the touch sensing circuit 150 can perform touch sensing using the self-capacitance sensing technique and/or the mutual-capacitance sensing technique. Hereinafter, for convenience of description, it is assumed that the touch sensing circuit 150 performs touch sensing using the self-capacitance sensing technique.

In one embodiment, each of the touch driving circuit 160 and the touch controller 170 may be implemented in a separate integrated circuit. In another embodiment, the touch driving circuit 160 and the touch controller 170 may be integrated into a single integrated circuit.

In one embodiment, each of the touch driving circuit 160 and the data driving circuit 120 may be implemented in a separate integrated circuit. In another embodiment, the touch driving circuit 160 and the data driving circuit 120 may be integrated into a single integrated circuit. For example, in an example where the touch display device 100 includes one driving integrated circuit chip, the one driving integrated circuit chip may include the touch driving circuit 160 and the data driving circuit 120. In another example, in an example where the touch display device 100 includes two or more driving integrated circuit chips, each of the two or more driving integrated circuit chips may include one or more elements of the touch driving circuit 160 and one or more elements of the data driving circuit 120.

The touch display device 100 may further include a power supply circuit for supplying various types of power to the display driving circuit and/or the touch sensing circuit.

The touch display device 100 according to aspects of the present disclosure may be a mobile terminal such as a smart phone, a tablet, or the like, or a monitor or television (TV) of various sizes, but embodiments of the present disclosure are not limited thereto. For example, the touch display device 100 may include displays of various types, or displays of various sizes, suitable for presenting information or images.

Figure 2:
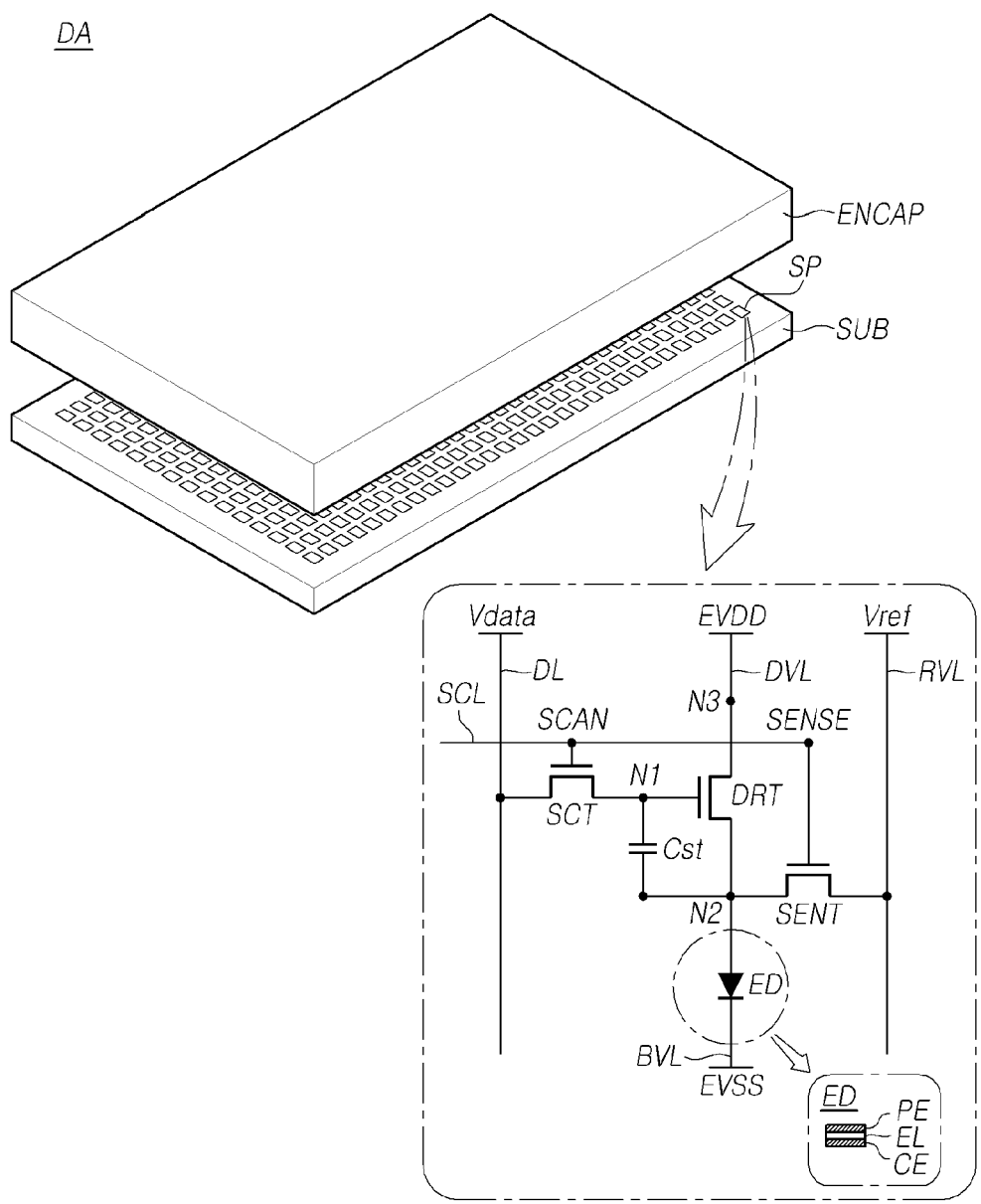
FIG. 2 illustrates configuration of an example display panel of the touch display device according to embodiments of the present disclosure.

FIG. 2 illustrates configuration of an example display panel (e.g., the display panel 110 of FIG. 1) of the touch display device 100 according to embodiments of the present disclosure.

Referring to FIG. 2, each of subpixels SP disposed in the display area DA of the display panel 110 of the touch display device 100 may include a light emitting element ED, a driving transistor DRT for driving the light emitting element ED, a scan transistor SCT for transmitting a data voltage VDATA to a first node N1 of the driving transistor DRT, and a storage capacitor Cst for maintaining a voltage at an approximate constant level during one frame.

The driving transistor DRT may include the first node N1 to which a data voltage is applied, a second node N2 electrically connected to the light emitting element ED, and a third node N3 to which a driving voltage EVDD through a driving voltage line DVL is applied. In the driving transistor DRT, the first node N1 may be a gate node, the second node N2 may be a source node or a drain node, and the third node N3 may be the drain node or the source node. Hereinafter, for convenience of description, the first node N1 of the driving transistor DRT is also referred to as a gate node or a gate electrode, the second node N2 of the driving transistor DRT is also referred to as a source node or a source electrode, and the third node N3 of the driving transistor DRT is also referred to as a drain node or a drain electrode.

The light emitting element ED may include a pixel electrode PE, an emission layer EL, and a common electrode CE. The pixel electrode PE of the light emitting element ED may be electrically connected to the second node N2 of the corresponding driving transistor DRT of each subpixel SP. The common electrode CE of the light emitting element ED may be electrically connected to a base voltage line BVL through which a base voltage EVSS is transmitted.

The pixel electrode PE may be disposed for each subpixel SP. The base voltage EVSS, which is a type of common voltage commonly required for driving the subpixels SP, may be applied to the common electrode CE.

For example, the pixel electrode PE may be an anode electrode, and the common electrode CE may be a cathode electrode. In another example, the pixel electrode PE may be the cathode electrode, and the common electrode CE may be the anode electrode.

The light emitting element ED may be, for example, an organic light emitting diode (OLED), an inorganic light emitting diode, a quantum dot light emitting element, or the like. In an embodiment where an organic light emitting diode (OLED) is used as the light emitting element ED, the emission layer EL thereof may include an organic emission layer including an organic material.

The scan transistor SCT can be turned on and off by a scan signal SCAN, which is a gate signal applied through a scan signal line SCL, and be electrically connected between the first node N1 of the driving transistor DRT and a data line DL.

The storage capacitor Cst may be connected between the first node N1 and the second node N2 of the driving transistor DRT.

Referring to FIG. 2, each of the plurality of subpixels SP disposed in the display area DA of the display panel 110 of the touch display device 100 may basically include a light emitting element ED, two transistors (DRT and SCT) and one capacitor (Cst).

Each of the plurality of subpixels SP disposed in the display area DA of the display panel 110 of the touch display device 100 may further include one or more transistors or one or more capacitors.

For example, as shown in FIG. 2, each subpixel SP may further include a sensing transistor SENT for controlling a connection between the second node N2 of the driving transistor DRT and a reference voltage line RVL. The reference voltage line RVL may be a signal line for supplying a reference voltage Vref to the subpixel SP.

As shown in FIG. 2, in one embodiment, the gate node of the sensing transistor SENT may be electrically connected to the gate node of the scan transistor SCT. That is, the scan signal line SCL electrically connected to the gate node of the scan transistor SCT may also be electrically connected to the gate node of the sensing transistor SENT.

In another embodiment, the gate node of the sensing transistor SENT may be electrically connected to a sensing signal line or another scan signal line other than the scan signal line SCL connected to the gate node of the scan transistor SCT.

In some embodiments, the storage capacitor Cst, which may be present between the first node N1 and the second node N2 of the driving transistor DRT, may be an external capacitor intentionally configured or designed to be located outside of the driving transistor DRT, other than internal capacitors, such as parasitic capacitors (e.g., a gate-to-source capacitance Cgs, a gate-to-drain capacitance Cgd, and the like).

Each of the driving transistor DRT, the scan transistor SCT, and the sensing transistor SENT may be an n-type transistor, or a p-type transistor.

Since circuit elements (in particular, a light emitting element ED) in each subpixel SP are vulnerable to external moisture or oxygen, an encapsulation layer ENCAP may be disposed in the display panel 110 in order to prevent or at least reduce the external moisture or oxygen from penetrating into the circuit elements (in particular, the light emitting element ED).

The encapsulation layer ENCAP may be disposed in various types or have various shapes.

In one embodiment, the encapsulation layer ENCAP may be disposed such that it covers the light emitting elements ED. The encapsulation layer ENCAP may include one or more inorganic layers and one or more organic layers.

In another embodiment, the encapsulation layer ENCAP may include an encapsulation substrate, one or more dams located between a thin film transistor array substrate and the encapsulation substrate along an outer edge of the display area DA, and a filler filled in an inner space of the one or more dam.

Figure 3:
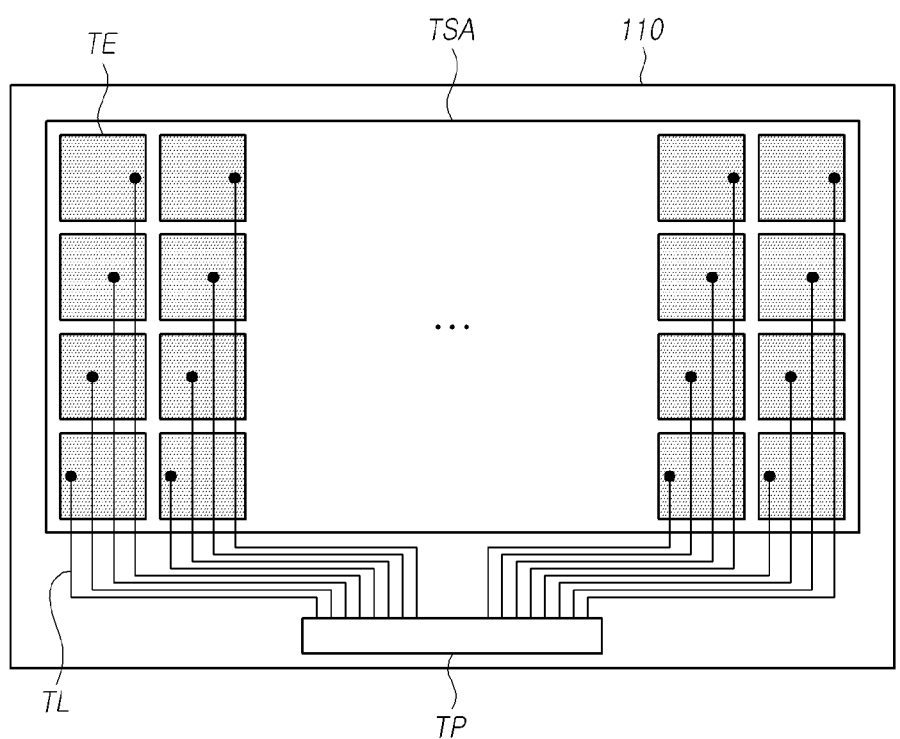
FIG. 3 illustrates an example touch sensor structure of the touch display device according to embodiments of the present disclosure.

FIG. 3 illustrates an example touch sensor structure of the touch display device 100 according to embodiments of the present disclosure.

Referring to FIG. 3, in one or more embodiments, the display panel 110 of the touch display device 100 according to aspects of the present disclosure may include a touch sensing area TSA for sensing a touch. A touch sensor may be disposed in the touch sensing area TSA.

In one or more embodiments, the touch sensor included in the touch display device 100 may include a plurality of touch electrodes TE disposed in the touch sensing area TSA. The touch sensing area TSA may include a plurality of touch sensor areas in which a plurality of touch electrodes TE are disposed.

In one or more embodiments, the touch sensor included in the touch display device 100 may be further include a plurality of touch lines TL for electrically connecting the plurality of touch electrodes TE to a plurality of touch pads TP to which the touch driving circuit 160 is electrically connected. Such touch lines TL are sometimes referred to as touch routing lines.

In one or more embodiments, when the touch sensor included in the touch display device 100 is configured with the self-capacitance sensing technique, the plurality of touch electrodes TE do not electrically overlap and do not intersect one another. In the touch sensor structure based on self-capacitance sensing technique, each of the plurality of touch electrodes TE may be a respective touch node corresponding to a touch coordinate.

In one or more embodiments, when the touch display device 100 is configured to sense a touch based on self-capacitance sensing technique, the touch driving circuit 160 can supply a touch driving signal to one or more of the plurality of touch electrodes TE and sense one or more touch electrodes TE to which the touch driving signal is supplied.

Each of the plurality of touch electrodes TE may be an electrode without an opening or a mesh-type electrode having a plurality of openings. Further, each of the plurality of touch electrodes TE may be a transparent electrode.

A value of obtained by sensing one or more touch electrodes TE to which the touch driving signal is supplied may be a capacitance, or a value corresponding to a capacitance variance, in the one or more touch electrodes TE to which the touch driving signal is supplied. The capacitance at the one or more touch electrodes TE to which the touch driving signal is supplied may be a capacitance between the one or more touch electrodes TE to which the touch driving signal is supplied and a touch pointer such as a finger, a pen, or the like.

As described above, in one or more embodiments, the touch sensor including the touch electrodes TE may be embedded in the display panel 110 included in the touch display device 100. Accordingly, during the process of manufacturing the display panel 110, when electrodes, lines, and patterns related to display driving are formed, the touch electrodes TE and the touch lines TL may also be formed together.

Figure 4:
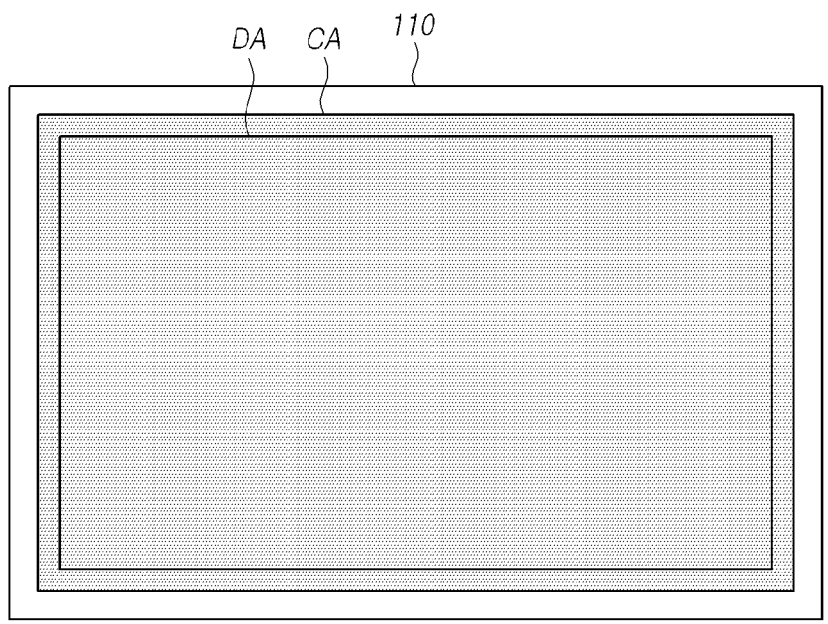
FIG. 4 is an example plan view of the display panel of the touch display device according to embodiments of the present disclosure.

FIG. 4 is an example plan view of the display panel 110 of the touch display device 100 according to embodiments of the present disclosure.

Referring to FIG. 4, in one or more embodiments, the display panel 110 included in the touch display device 100 may include a common electrode area CA overlapping the display area DA and allowing one or more common electrodes CE to be disposed.

For example, the common electrode area CA may have substantially the same area (size) as the display area DA. In this example, all, or substantially or nearly all, of the common electrode area CA and all, or substantially or nearly all, of the display area DA may overlap each other. In another example, as shown in FIG. 4, the common electrode area CA may have a greater area (size) than the display area DA. In this example, the common electrode area CA may include an area overlapping all of the display area DA and an area overlapping a portion of the non-display area NDA.

As an example of disposing one or more common electrodes CE in the common electrode area CA, in terms of vertical location, the one or more common electrodes CE may be disposed in a common electrode layer.

For example, one or more dummy common electrodes, as well as the one or more common electrodes CE, may be disposed in the common electrode layer, Thus, the touch display device 100 may include the one or more common electrodes CE and the one or more dummy common electrodes. In one or more embodiments, the one or more common electrodes CE and one or more dummy common electrodes may be disposed together in the common electrode area CA, and may be located together in the common electrode layer.

In one or more implementation, the one or more common electrodes CE and the one or more dummy common electrodes disposed in the touch display device 100 are needed to be physically separated from each other and electrically separated from each other.

In one or more embodiments, in the touch display device 100, the one or more common electrodes CE may be electrodes for display driving, and be opposite to at least one or more of pixel electrodes forming respective light emitting elements ED of a plurality of subpixels SP. For example, a base voltage EVSS may be applied to the one or more common electrodes CE. Hereinafter, the common electrode CE may be also referred to as a display common electrode, a cathode electrode, or a display cathode electrode.

In one or more embodiments, in the touch display device 100, one or more dummy common electrodes may include the same material as one or more common electrodes CE and be patterns formed together with the one or more common electrodes CE during a manufacturing process.

In one or more embodiments, in the touch display device 100, one or more dummy common electrodes may not be used for display driving, and also be required not to affect display driving.

The structure employed in the touch display device 100 in which the one or more common electrodes CE and the one or more dummy common electrodes are disposed to be separated from each other may be referred to as a common electrode division structure.

The common electrode division structure may have one of first to third types. In the first type of common electrode division structure, a common electrode material disposed in the common electrode layer may be divided into one common electrode CE and a plurality of dummy common electrodes. In the second type of common electrode division structure, the common electrode material disposed in the common electrode layer may be divided into a plurality of common electrodes CE and one dummy common electrode. In the third type of common electrode division structure, the common electrode material disposed in the common electrode layer may be divided into a plurality of common electrodes CE and a plurality of dummy common electrodes.

Hereinafter, the first type of common electrode division structure will be described in more detail with reference to FIG. 5, the second type of common electrode division structure will be described in more detail with reference to FIG. 6, and the third type of common electrode division structure will be described in more detail with reference to FIG. 7.

Figure 5:
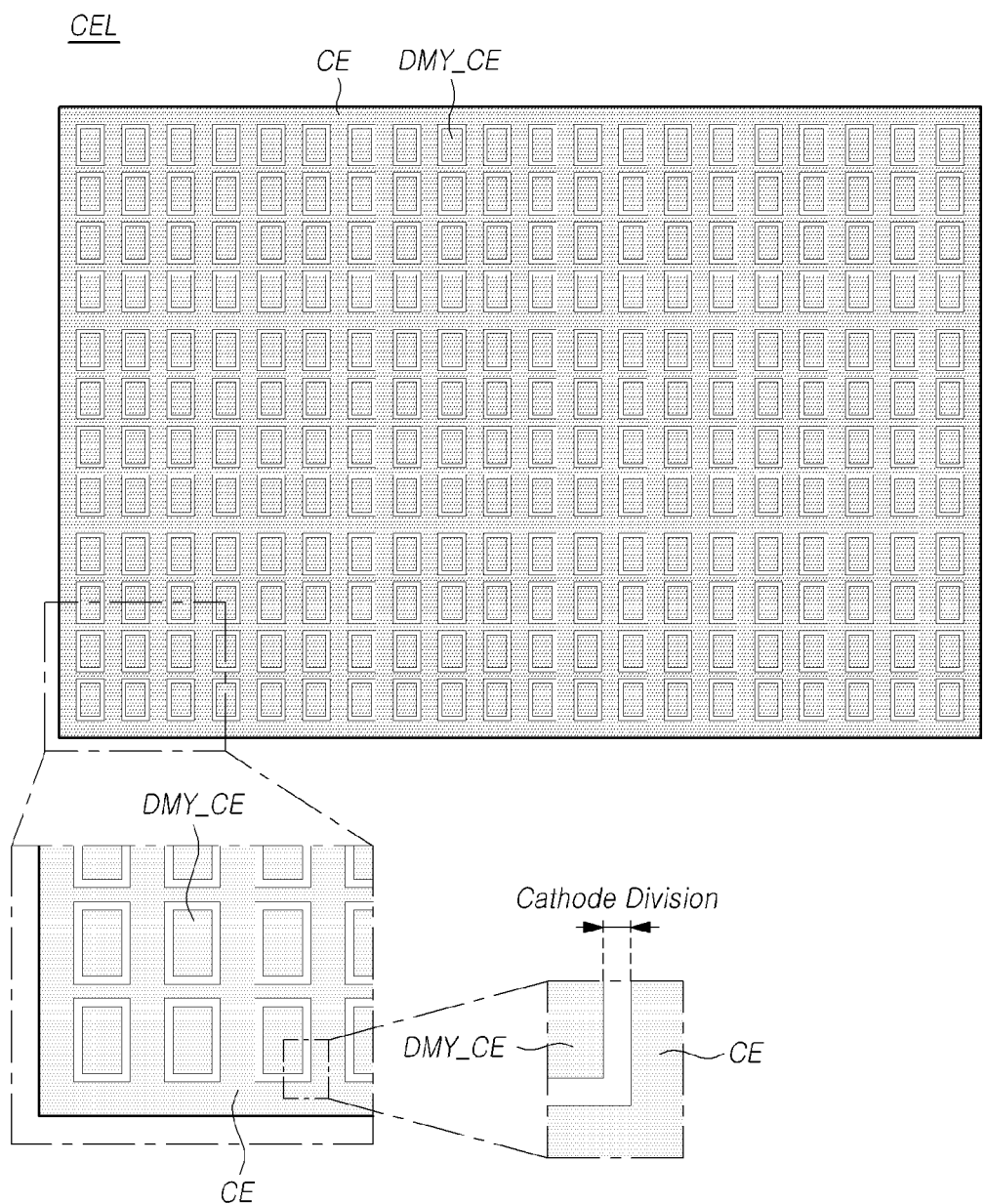
FIG. 5 illustrates an example common electrode division structure disposed in the display panel of the touch display device according to embodiments of the present disclosure.

FIG. 5 illustrates the first type of common electrode division structure employed in the display panel 110 of the display device 100 according to embodiments of the present disclosure.

Referring to FIG. 5, in one or more embodiments, when the touch display device 100 has the first type of common electrode division structure, one common electrode CE and a plurality of dummy common electrodes DMY_CE may be disposed in a common electrode layer CEL. The common electrode CE and the plurality of dummy common electrodes DMY_CE may be formed from the same material (hereinafter referred to as a common electrode material).

A lower insulating layer located under the common electrode layer CEL may have an under-cut pattern in which a portion or edge (e.g., a lower, upper, or side portion or edge) of the lower insulating layer is recessed inwardly, and when the common electrode material is deposited on the lower insulating layer, the common electrode material can be cut off at the under-cut portion of the lower insulating layer. Common electrode materials divided by the under-cut portion can serve as the common electrode CE and the dummy common electrodes DMY_CE. For example, the lower insulating layer to which such an under-cut pattern can be formed may include a pixel electrode layer where an anode electrode AE is formed, an overcoat layer, a bank, and/or the like.

The common electrode CE may be an electrode opposite to all or one or more of pixel electrodes PE forming respective light emitting elements ED of a plurality of subpixels SP, and a base voltage EVSS may be applied to the common electrode CE.

The plurality of dummy common electrodes DMY_CE may be arranged to be spaced apart from each other in an island shape. The plurality of dummy common electrodes DMY_CE may be disposed adjacent to the common electrode CE, but embodiments of the present disclosure are not limited thereto. For example, the plurality of dummy common electrodes DMY_CE may be disposed apart from the common electrode CE. The plurality of dummy common electrodes DMY_CE may be electrically separated from the common electrode CE.

Referring to FIG. 5, in one or more embodiments, when the touch display device 100 has the first type of common electrode division structure, the common electrode CE may have a plurality of openings. The plurality of dummy common electrodes DMY_CE may be located in an island shape in inner spaces of the plurality of openings formed in the common electrode CE.

Referring to FIG. 5, a common electrode CE, which is one type of display driving electrode (i.e., one of display driving electrodes), or a portion thereof may be disposed between two dummy common electrodes DMY_CE adjacent to each other among the plurality of dummy common electrodes DMY_CE.

Referring to FIG. 5, one or more subpixels SP or respective one or more light emitting areas of the one or more subpixels SP may be disposed between two common electrode TCE adjacent to each other among the plurality of dummy common electrodes DMY_CE.

In one embodiment, an area (size) of each of the plurality of dummy common electrodes DMY_CE may be the same as an area (size) of one subpixel SP or the area of the one subpixel SP.

In another embodiment, an area (size) of each of the plurality of dummy common electrodes DMY_CE may be greater than an area (size) of one subpixel SP or the area of the one subpixel SP. For example, an area (size) of each of the plurality of dummy common electrodes DMY_CE may be the same as an area (size) of two or more subpixels SP or the area of the two or more subpixels SP.

Figure 6:
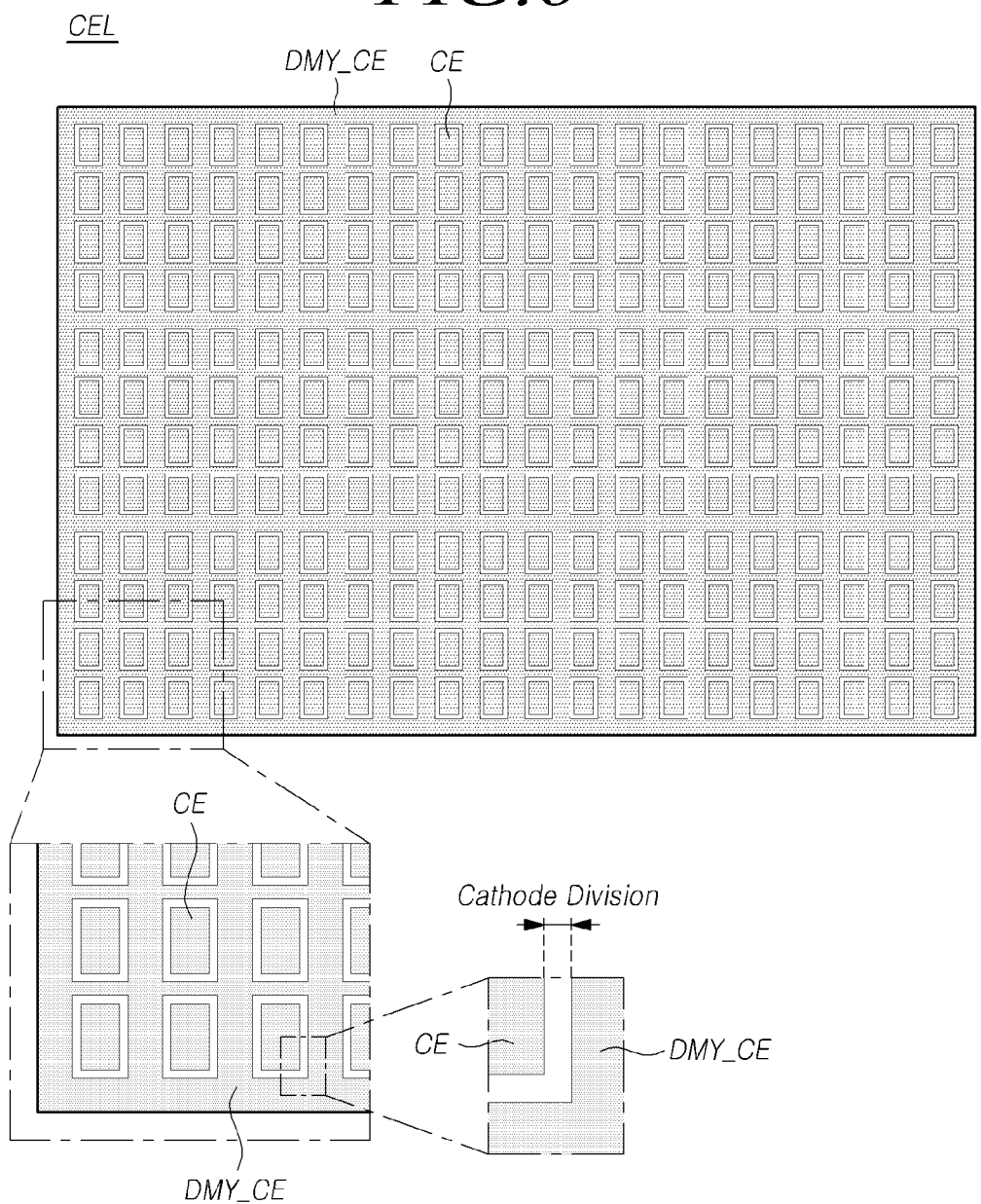
FIG. 6 illustrates another example common electrode division structure disposed in the display panel of the touch display device according to embodiments of the present disclosure.

FIG. 6 illustrates the second type of common electrode division structure employed in the display panel 110 of the display device 100 according to aspects of the present disclosure.

Referring to FIG. 6, in one or more embodiments, when the touch display device 100 has the second type of common electrode division structure, one dummy common electrode DMY_CE and a plurality of common electrodes CE may be disposed in a common electrode layer CEL. The dummy common electrode DMY_CE and the plurality of common electrodes CE may be formed from the same material (hereinafter referred to as a common electrode material).

The plurality of common electrodes CE may be electrodes opposite to pixel electrodes PE forming respective light emitting elements ED of a plurality of subpixels SP, and a base voltage EVSS may be applied to the plurality of common electrodes CE.

The plurality of common electrodes CE may be disposed adjacent to the dummy common electrode DMY_CE, but embodiments of the present disclosure are not limited thereto. For example, the plurality of common electrodes CE may be disposed apart from the dummy common electrode DMY_CE. The plurality of common electrodes CE may be electrically separated from the dummy common electrode DMY_CE.

Referring to FIG. 6, in one or more embodiments, when the touch display device 100 has the second type of common electrode division structure, the dummy common electrode DMY_CE may have a plurality of openings. The plurality of common electrode DMY_CE may be located in an island shape in inner spaces of the plurality of openings formed in the dummy common electrode DMY_CE.

Figure 7:
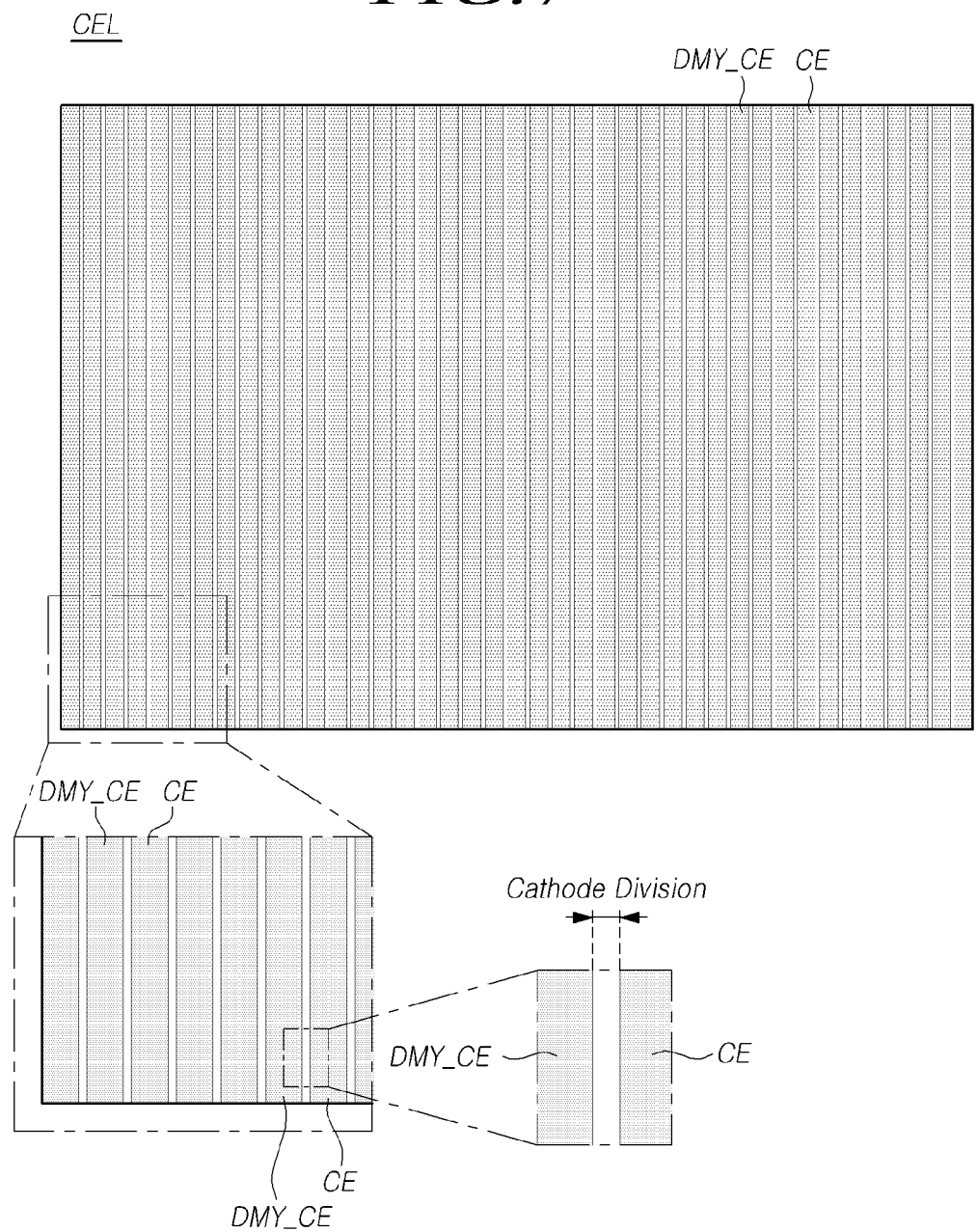
FIG. 7 illustrates further another example common electrode division structure disposed in the display panel of the touch display device according to embodiments of the present disclosure.

FIG. 7 illustrates the third type of common electrode division structure employed in the display panel 110 of the display device 100 according to aspects of the present disclosure.

Referring to FIG. 7, in one or more embodiments, when the touch display device 100 has the third type of common electrode division structure, a plurality of dummy common electrodes DMY_CE and a plurality of common electrodes CE may be alternately disposed in a common electrode layer CEL.

Referring to FIG. 7, each of the plurality of dummy common electrodes DMY_CE and the plurality of common electrodes CE may have a bar shape. The plurality of dummy common electrodes DMY_CE and the plurality of common electrodes CE may be formed from the same material (hereinafter referred to as a common electrode material).

The plurality of common electrodes CE may be electrodes opposite to pixel electrodes PE forming respective light emitting elements ED of a plurality of subpixels SP, and a base voltage EVSS may be applied to the plurality of common electrodes CE.

Each of the plurality of common electrodes CE may be adjacent to dummy common electrodes DMY_CE located on both sides of each common electrode CE, but be required to be spaced apart from the dummy common electrodes DMY_CE. Thus, the plurality of common electrodes CE may be electrically separated from the plurality of dummy common electrodes DMY_CE.

Figure 8:
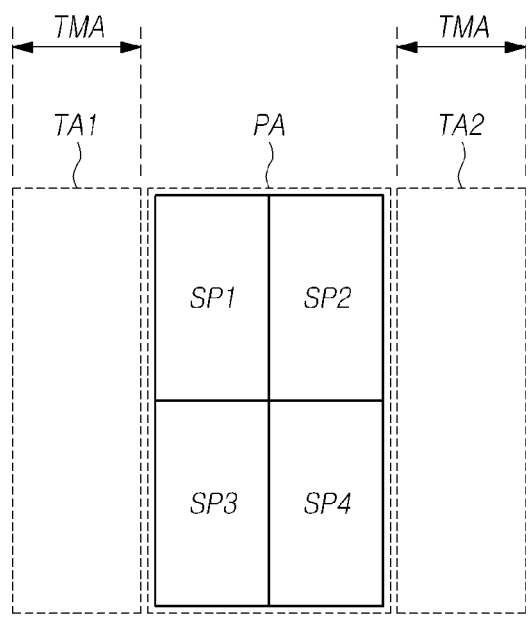
FIG. 8 illustrates example areas partitioned in a portion of the display panel of the touch display device according to embodiments of the present disclosure.

FIG. 8 illustrates example areas partitioned in a portion of the display panel 110 of the touch display device 100 according to embodiments of the present disclosure.

Referring to FIG. 8, in one or more embodiments, a portion of the display panel 110 of the touch display device 100 may include a pixel area PA, a first touch sensor area TA1, and a second touch sensor area TA2.

Referring to FIG. 8, the first touch sensor area TA1 may be located on a first side of the pixel area PA, and the second touch sensor area TA2 may be located on a second opposing side of the pixel area PA.

Referring to FIG. 8, at least one subpixel (SP1, SP2, SP3, and/or SP4) may be disposed in the pixel area PA between the first touch sensor area TA1 and the second touch sensor area TA2.

Referring to FIG. 8, four subpixels (SP1, SP2, SP3, and SP4) may be disposed in the pixel area PA between the first touch sensor area TA1 and the second touch sensor area TA2. The four subpixels (SP1, SP2, SP3, and SP4) may include a subpixel emitting red light, a subpixel emitting green light, a subpixel emitting blue light, and a subpixel emitting white light.

Referring to FIG. 8, the pixel area PA may be included in a non-transmissive area through which light cannot pass, and the first touch sensor area TA1 and the second touch sensor area TA2 may be a transmissive area TMA through which light can pass. The transmissive area TMA may refer to an area allowing external light to pass, and thereby enabling a lower portion of, or a portion under, the display panel 110 to be viewed from the front of the display panel 110.

Figure 9:
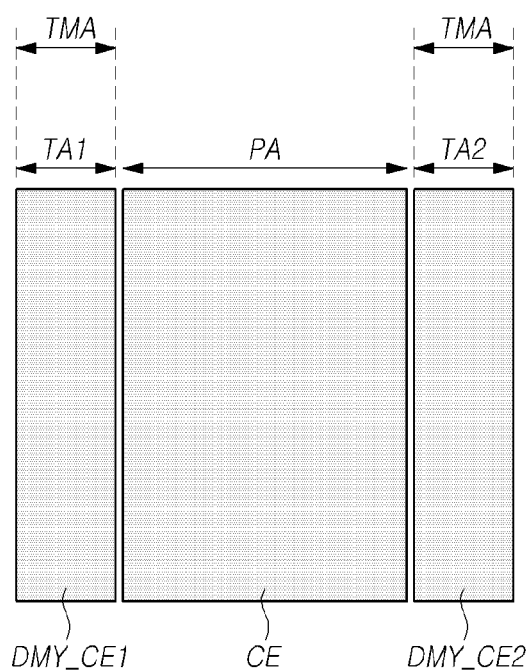
FIG. 9 illustrates an example common electrode division structure in a portion of the display panel of the touch display device according to aspects of the present disclosure.

FIG. 9 illustrates an example common electrode division structure employed in a portion of the display panel 110 of the display device 100 according to embodiments of the present disclosure.

Referring to FIG. 9, a common electrode CE to which a base voltage EVSS for display driving is applied may be disposed in a pixel area PA.

Referring to FIG. 9, in one embodiment, a first dummy common electrode DMY_CE1 may be disposed in a first touch sensor area TA1, and a second dummy common electrode DMY_CE2 may be disposed in a second touch sensor area TA2. Referring to FIG. 9, in another embodiment, a first dummy common electrode DMY_CE1 may not be disposed in the first touch sensor area TA1, and a second dummy common electrode DMY_CE2 may not be disposed in the second touch sensor area TA2. Hereinafter, discussions that follow are provided based on an example where the first dummy common electrode DMY_CE1 is disposed in the first touch sensor area TA1, and the second dummy common electrode DMY_CE2 is disposed in the second touch sensor area TA2.

For example, the first dummy common electrode DMY_CE1 and the second dummy common electrode DMY_CE2 may have the same shape or the same area (or size). In another example, one of the first dummy common electrode DMY_CE1 and the second dummy common electrode DMY_CE2 may have a different shape or area (or size) from the other.

Referring to FIG. 9, for example, the common electrode CE may include an electrode protrusion. In this implementation, the first dummy common electrode DMY_CE1 may include an electrode groove in which the electrode protrusion of the common electrode CE is located.

The electrode protrusion of the common electrode CE and the electrode groove of the first dummy common electrode DMY_CE1 may be electrically separated from each other. The electrode protrusion of the common electrode CE may be disposed to extend past an outer edge, and to an inside portion, of the first touch sensor area TA1.

Referring to FIG. 9, in one embodiment, the common electrode CE may be disposed only in the pixel area PA, the first dummy common electrode DMY_CE1 may be disposed only in the first touch sensor area TA1, and the second dummy common electrode DMY_CE2 may be disposed only in the second touch sensor area TA2.

In another embodiment, a portion of a first edge of the common electrode CE may be disposed to extend past an outer edge, and to an inside portion, of the first touch sensor area TA, or a portion of a second opposing edge of the common electrode CE may be disposed to extend past an outer edge, and to an inside portion, of the second touch sensor area TA.

For example, the pixel area PA may be defined as an area where the common electrode CE is disposed, the first touch sensor area TA1 may be defined as an area where the first dummy common electrode DMY_CE1 located on a first side of the common electrode CE is disposed, and the second touch sensor area TA2 may be defined as an area where the second dummy common electrode DMY_CE2 located on a second opposing side of the common electrode CE is disposed.

In another example, the pixel area PA may be defined as an area where the pixel electrode PE is disposed, and light emitting can be performed, the first touch sensor area TA1 may be located on a first side of the pixel area PA and included in a transmissive area TMA in which light emitting cannot be performed, or light can be transmitted, and the second touch sensor area TA2 may be located on a second opposing side of the pixel area PA and included in a transmissive area TMA in which light emitting cannot be performed, or light can be transmitted.

Referring to FIG. 9, the common electrode CE disposed in the pixel area PA may be included in the non-transmissive area. In contrast, the first dummy common electrode DMY_CE1 disposed in the first touch sensor area TA1 and the second dummy common electrode DMY_CE2 disposed in the second touch sensor area TA2 may be included in the transparent areas TMA.

In one or more embodiments, when the touch display device 100 is configured to provide both transparent displaying and touch sensing, a suitable touch sensor structure may be provided the touch display device 100. Hereinafter, an example touch sensor structure in the touch display device 100 according to embodiments of the present disclosure will be described in detail.

Figure 10:
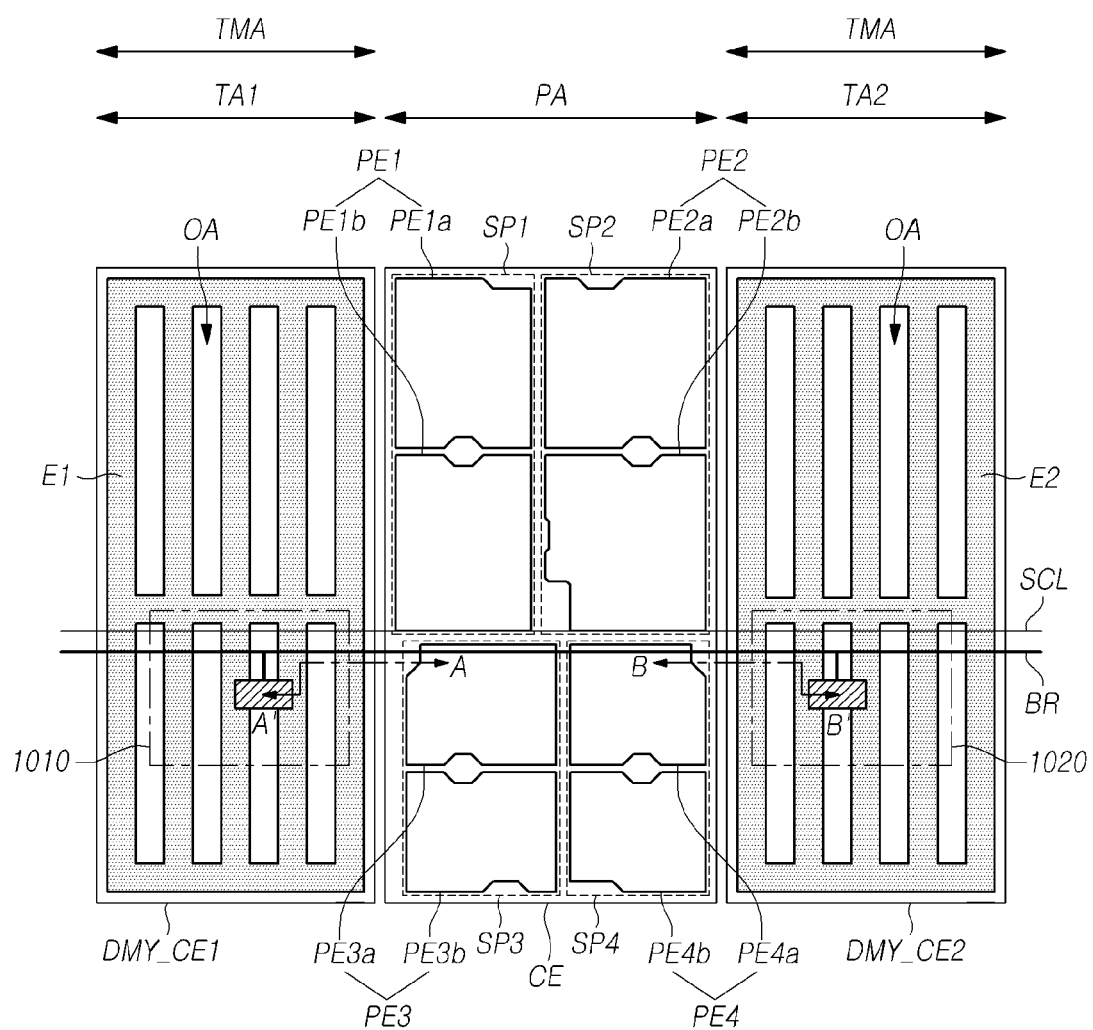
FIG. 10 is an example plan view of the display panel of the touch display device according to embodiments of the present disclosure.

FIG. 10 is an example plan view of the display panel 110 of the touch display device 100 according to embodiments of the present disclosure.

The touch sensor structure of the touch display device 100 according to embodiments of the present disclosure will be described based on an example area of the display panel 110 in FIG. 10. The example area of the display panel 110 illustrated in FIG. 10 may be a unit area representing characteristics of the entire area of the display panel 110.

Referring to FIG. 10, the display panel 110 may include a pixel area PA, a first touch sensor area TA1, and a second touch sensor area TA2.

The pixel area PA may be an area where at least one subpixel SP is disposed. The first touch sensor area TA1 may be located on a first side of the pixel area PA, and the second touch sensor area TA2 may be located on a second opposing side of the pixel area PA.

At least one subpixel SP may be disposed in the pixel area PA between the first touch sensor area TA1 and the second touch sensor area TA2. According to this implementation, at least one pixel electrode PE may be disposed in the pixel area PA.

Referring to FIG. 10, four or more subpixels SP may be disposed in the pixel area PA between the first touch sensor area TA1 and the second touch sensor area TA2. According to this implementation, four or more pixel electrodes PE may be disposed in the pixel area PA.

Hereinafter, discussions are provided based on the example where first to fourth subpixels (SP1, SP2, SP3, and SP4) are disposed in the pixel area PA, and first to fourth pixel electrodes (PE1, PE2, PE3, and PE4) are disposed in the pixel area PA.

In one or more embodiments, the display panel 110 of the touch display device 100 may include the pixel area PA in which the first to fourth subpixels (SP1, SP2, SP3, and SP4) are disposed, the first touch sensor area TA1 located on a first side of the pixel area PA, the second touch sensor area TA2 located on a second opposing side of the pixel area PA, the first to fourth pixel electrodes (PE1, PE2, PE3, and PE4) disposed in the pixel area PA and including a first metal, the first electrode E1 disposed in the first touch sensor area TA1 and including the first metal, and the second electrode E2 disposed in the second touch sensor area TA2 and including the first metal.

In the display panel 110 of the touch display device 100, the first electrode E1 and the second electrode E2 located on opposing sides of the pixel area PA may be portions serving as touch electrodes TE.

The touch sensor structure according to embodiments of the present disclosure can be characteristics by the material of the first electrode E1 and the second electrode E2 located on opposing sides of the pixel area PA and serving as touch electrodes TE.

In the touch sensor structure according to embodiments of the present disclosure, the material of the first electrode E1 and the second electrode E2 located on opposing sides of the pixel area PA and serving as touch electrodes TE may be the same as that of the first to fourth pixel electrodes (PE1, PE2, PE3, and PE4) located in the pixel area PA.

In the touch sensor structure according to embodiments of the present disclosure, the first electrode E1 and the second electrode E2 located on opposing sides of the pixel area PA and serving as touch electrodes TE may include the first metal included in the first to fourth pixel electrodes (PE1, PE2, PE3, and PE4) located in the pixel area PA.

Accordingly, during the process of manufacturing the display panel 110, the first electrode E1 and the second electrode E2 located on opposing sides of the pixel area PA and serving as touch electrodes TE can be formed together with the first to fourth pixel electrodes (PE1, PE2, PE3, and PE4) located in the pixel area PA.

Referring to FIG. 10, the touch sensor structure according to embodiments of the present disclosure may further include a bridge BR for electrically interconnecting the first electrode E1 and the second electrode E2, in addition to the first electrode E1 and the second electrode E2.

Referring to FIG. 10, the bridge BR may be disposed across the first touch sensor area TA1, the pixel area PA, and the second touch sensor area TA2.

Referring to FIG. 10, the first touch sensor area TA1 and the second touch sensor area TA2 may be areas in which the first electrode E1 and the second electrode E2 are disposed, which serve as touch electrodes TE as a touch sensor.

Referring to FIG. 10, the first touch sensor area TA1 and the second touch sensor area TA2 may be included in transmissive areas TMA through which external light can be transmitted to enable a lower portion of, or a portion under, the display panel 110 to be viewed from the front of the display panel 110. Transparent display can be enabled by the first touch sensor area TA1 and the second touch sensor area TA2.

Since the first touch sensor area TA1 and the second touch sensor area TA2 are included in the transmissive areas TMA, the numbers of metal layers disposed in the first touch sensor area TA1 and the second touch sensor area TA2 may be less than the number of metal layers disposed in the pixel area PA.

The first metal may include a transparent electrode material or may be a metal having a predetermined thickness or less. For example, the thickness of the first metal may be a thickness suitable for satisfying the transparency, which is required to provide by the touch display device 100.

For example, the touch sensor structure may be configured such that the first electrode E1 is a mesh-type electrode having at least one opening OA, and the second electrode E2 is the mesh-type electrode having at least one opening OA. According to this example, transparency of the first touch sensor area TA1 and the second touch sensor area TA2 can be improved.

In another example, the touch sensor structure may be configured such that the first electrode E1 and the second electrode E2 may be plate-type electrodes without an opening OA.

Referring to FIG. 10, in the touch sensor structure according to embodiments of the present disclosure, the bridge BR may be disposed parallel to one or more scan signal lines SCL and may cross one or more data lines DL.

A material included in the bridge BR and a material included in the scan signal line SCL may be the same or different from each other.

For example, the entirety of the bridge BR may be form from one material. For example, the bridge BR may have a form in which several parts are connected, and the parts included in the bridge BR may include two or more materials.

Hereinafter, functions of first and second dummy common electrodes DMY_CE1 and DMY_CE2 will be described in terms of transparent display and touch sensing. For convenience of description, discussions are provided based on the first electrode E1 and the first dummy common electrode DMY_CE1.

Referring to FIG. 10, since the first electrode E1 serving as the touch electrode TE is disposed in the transmissive area TMA, the first electrode E1 may be disposed in a mesh shape to improve transmittance (transparency). In the example where the first electrode E1 serving as the touch electrode TE is disposed in the transmissive area TMA in the mesh shape, electric charges charged between a touch pointer such as a finger and the first electrode E1 may be relatively small, and thereby, a touch sensing signal from the first electrode E1 may be weakened. In contrast, as the first dummy common electrode DMY_CE1 having a much larger area than the first electrode E1 is disposed on the first electrode E1, more electric charges can be charged in the first electrode E1 by the large area of the first dummy common electrode DMY_CE1.

Therefore, even when the first electrode E1 serving as the touch electrode is disposed in the mesh shape at a low density in the transmissive area TMA in order to improve transmittance, since the first dummy common electrode DMY_CE1 having the large area is disposed on the first electrode E1, a touch sensing signal at the first electrode E1 can be strengthened, and thereby, touch sensitivity can be improved.

Figure 11A:
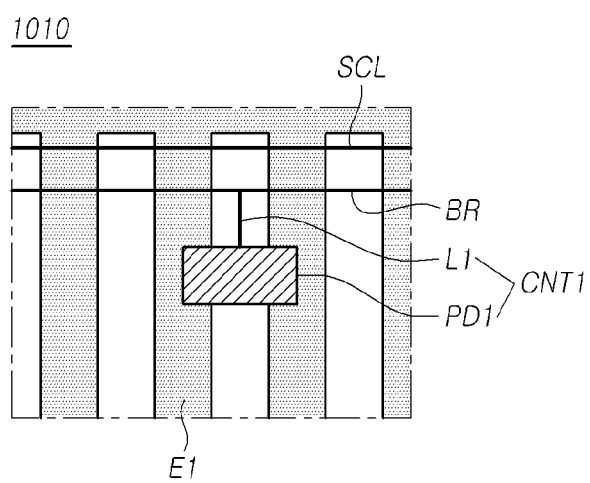
FIG. 11A is an example plan view of a connection area between a first electrode and a bridge in FIG. 10 according to embodiments of the present disclosure.
Figure 11B:
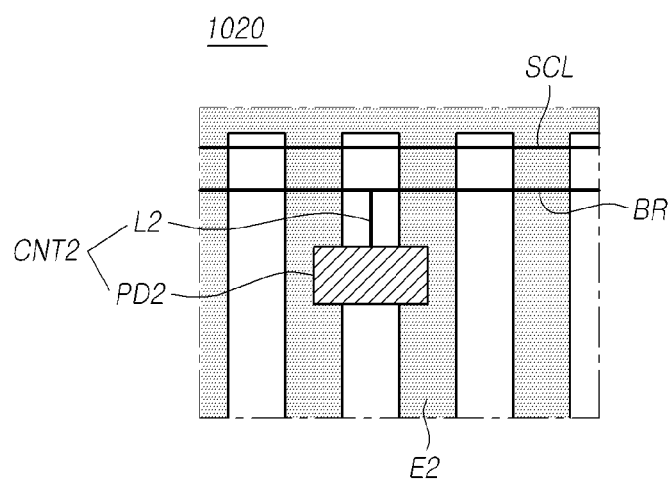
FIG. 11B is an example plan view of a connection area between a second electrode and the bridge in FIG. 10 according to embodiments of the present disclosure.
Figure 12A:
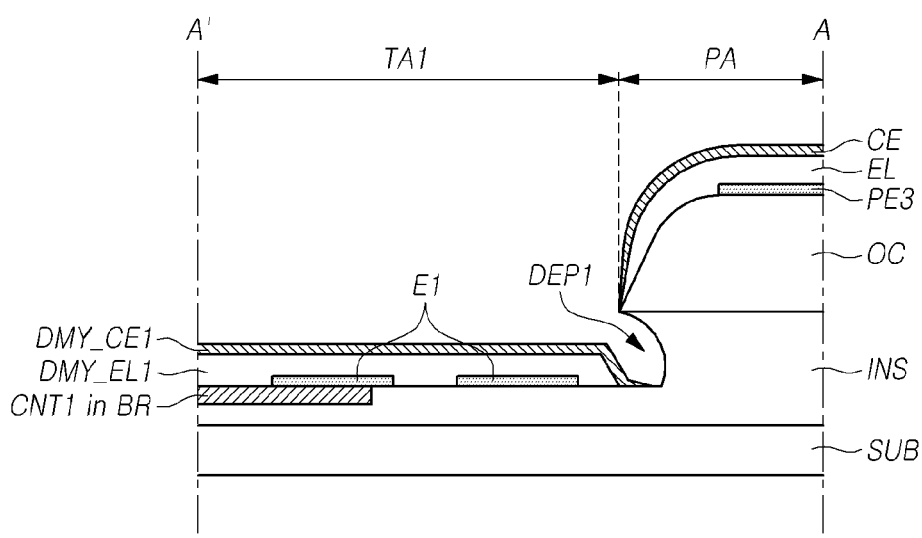
FIG. 12A is an example cross-sectional view taken along line A-A' of FIG. 10 according to embodiments of the present disclosure.
Figure 12B:
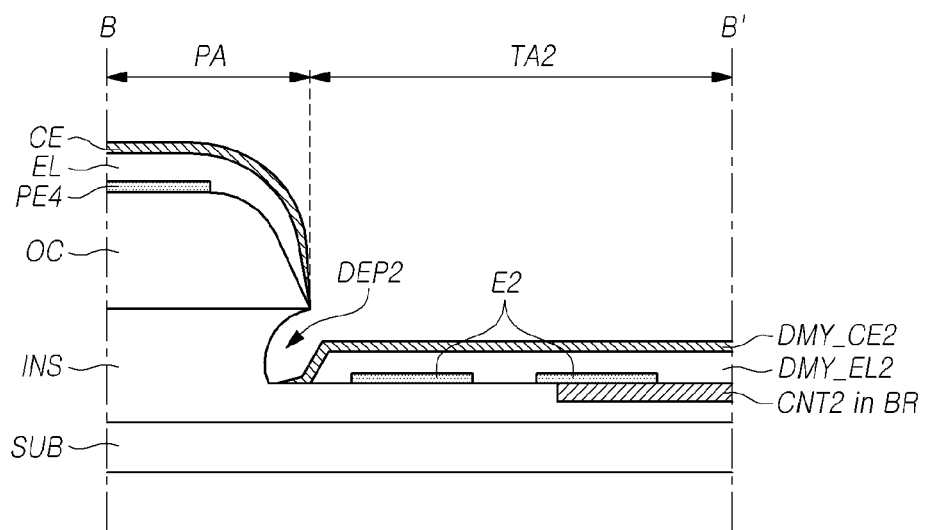
FIG. 12B is an example cross-sectional view taken along line B-B' of FIG. 10 according to embodiments of the present disclosure.

FIG. 11A is an example plan view of a connection area 1010 between the first electrode E1 and the bridge BR in FIG. 10 according to one embodiment. FIG. 11B is an example plan view of a connection area 1020 between the second electrode E2 and the bridge BR in FIG. 10 according to one embodiment. FIG. 12A is an example cross-sectional view taken along line A-A' of FIG. 10 according to one embodiment. FIG. 12B is an example cross-sectional view taken along line B-B' of FIG. 10 according to one embodiment.

Referring to FIGS. 11A and 11B, the bridge BR may include a first connector CNT1 electrically connected to the first electrode E1 and a second connector CNT2 electrically connected to the second electrode E2.

Referring to FIGS. 11A and 11B, the first connector CNT1 may include a first connection line L1 extending from the bridge BR and a first pad PD1 connected to the first electrode E1. The second connector CNT2 may include a second connection line L2 extending from the bridge BR and a second pad PD2 connected to the second electrode E2.

All or a portion of the first pad PD1 may directly contact the first electrode E1. All or a portion of the second pad PD2 may directly contact the second electrode E2. According to this direct contact structure, a defect in the electrical connection between the first electrode E1 and the bridge BR and a defect in the electrical connection between the second electrode E2 and the bridge BR can be prevented or reduced.

The first connection line L1 may be a portion extending from the bridge BR, and may include the same material as the bridge BR. The second connection line L2 may be a portion extending from the bridge BR, and may include the same material as the bridge BR.

The first pad PD1 may include the same material as, or a different material from, the first connection line L1. The second pad PD2 may include the same material as, or a different material from, the second connection line L2.

Referring to FIGS. 12A and 12B, the first connector CNT1 of the bridge BR may be located under the first electrode E1. The second connector CNT2 of the bridge BR may be located under the second electrode E2.

Referring to FIGS. 12A and 12B, the first connector CNT1 may directly contact the rear surface of the first electrode E1. The second connector CNT2 may directly contact the rear surface of the second electrode E2.

Among the first connection line L1 and the first pad PD1 included in the first connector CNT1, the first pad PD1 may directly contact the rear surface of the first electrode E1. Among the second connection line L2 and the second pad PD2 included in the second connector CNT2, the second pad PD2 may directly contact the rear surface of the second electrode E2.

Referring to FIGS. 12A and 12B, in one or more embodiments, the display panel 110 according to aspects of the present disclosure may include: a substrate SUB; a lower insulating layer INS on the substrate SUB; an overcoat layer OC located between the lower insulating layer INS and at least one pixel electrode (PE1, PE2, PE3, and/or PE4) in the pixel area PA; an organic layer EL disposed in the pixel area PA and located on the at least one pixel electrode (PE1, PE2, PE3, and/or PE4); a first dummy organic layer DMY_EL1 disposed in the first touch sensor area TA1 and located on the first electrode E1; a second dummy organic layer DMY_EL2 disposed in the second touch sensor area TA2 and located on the second electrode E2; a common electrode CE on the organic layer EL; a first dummy common electrode DMY_CE1 on the first dummy organic layer DMY_EL1; and a second dummy common electrode DMY_CE2 disposed in the second touch sensor area TA2.

The lower insulating layer INS may include at least one passivation layer and/or an interlayer insulating layer. A gate insulating layer and/or at least one buffer layer may be further disposed between the lower insulating layer INS and the substrate SUB. In one or more embodiments, the lower insulating layer INS may further include a gate insulating layer and/or at least one buffer layer.

Referring to FIG. 12A, in the cross-sectional structure of the display panel 110 taken along line A-A' in FIG. 10, in the pixel area PA, the third pixel electrode PE3 may be disposed on the overcoat layer OC, the organic layer EL may be disposed on the third pixel electrode PE3, and the common electrode CE may be disposed on the organic layer EL.

Referring to FIG. 12A, in the pixel area PA, the third pixel electrode PE3, the organic layer EL, and the common electrode CE may be included in a light emitting element ED of the third subpixel SP3.

Referring to FIG. 12A, in the cross-sectional structure of the display panel 110 taken along line A-A' in FIG. 10, in the first touch sensor area TA1, the first connector CNT1 of the bridge BR may be disposed under the first electrode E1 and may directly contact the rear surface of the first electrode E1.

Referring to FIG. 12A, in the first touch sensor area TA1, the first dummy organic layer DMY_EL1 may be disposed on the first electrode E1, and the first dummy common electrode DMY_CE1 may be disposed on the first dummy organic layer DMY_EL1. In the first touch sensor area TA1, the first dummy common electrode DMY_CE1 may be an electrically floating electrode and do not receive any electrical signal or voltage.

Referring to FIG. 12B, in the cross-sectional structure of the display panel 110 taken along line B-B' in FIG. 10, in the pixel area PA, the fourth pixel electrode PE4 may be disposed on the overcoat layer OC, the organic layer EL may be disposed on the fourth pixel electrode PE4, and the common electrode CE may be disposed on the organic layers EL.

Referring to FIG. 12B, in the pixel area PA, the fourth pixel electrode PE4, the organic layer EL, and the common electrode CE may be included in a light emitting element ED of the fourth subpixel SP4.

Referring to FIG. 12B, in the cross-sectional structure of the display panel 110 taken along line B-B' in FIG. 10, in the second touch sensor area TA2, the second connector CNT2 of the bridge BR may be disposed under the second electrode E2 and may directly contact the rear surface of the second electrode E2.

Referring to FIG. 12B, in the second touch sensor area TA2, the second dummy organic layer DMY_EL2 may be disposed on the second electrode E2, and the second dummy common electrode DMY_CE2 may be disposed on the second dummy organic layer DMY_EL2. In the second touch sensor area TA2, the second dummy common electrode DMY_CE2 may be an electrically floating electrode and do not receive any electrical signal or voltage.

As shown in 12A and 12B, the stackup configuration of the first electrode E1, the first dummy organic layer DMY_EL1, and the first dummy common electrode DMY_CE1 in the first touch sensor area TA1, and the stackup configuration of the second electrode E2, the second dummy organic layer DMY_EL2, and the second dummy common electrode DMY_CE2 in the second touch sensor area TA2 may be similar to the stackup configuration of the third or fourth pixel electrode (PE3 or PE4), the organic layer EL, and the common electrode CE to form the light emitting element ED.

Referring to FIGS. 12A and 12B, the common electrode CE, the first dummy common electrode DMY_CE1, and the second dummy common electrode DMY_CE2 may include the same material. The common electrode CE and the first dummy common electrode DMY_CE1 may be spaced apart and electrically separated from each other. Likewise, the common electrode CE and the second dummy common electrode DMY_CE2 may be spaced apart and electrically separated from each other.

Referring to FIGS. 12A and 12B, a display common voltage, for example, a base voltage EVSS, may be applied to the common electrode CE. In contrast, although the first dummy common electrode DMY_CE1 and the second dummy common electrode DMY_CE2 may include the same material as the common electrode CE or be disposed in the same layer as the common electrode CE, the first dummy common electrode DMY_CE1 and the second dummy common electrode DMY_CE2 may be floating electrodes remaining in an electrically floating state.

As described above, referring to FIG. 12A, the stackup configuration of the first electrode E1, the first dummy organic layer DMY_EL1, and the first dummy common electrode DMY_CE1 in the first touch sensor area TA1 does not operate as a light emitting element. Referring to FIG. 12B, the stackup configuration of the second electrode E2, the second dummy organic layer DMY_EL2, and the second dummy common electrode DMY_CE2 in the second touch sensor area TA2 does not operate as a light emitting element.

In other words, the first electrode E1 and the second electrode E2 serving as touch electrodes TE may include the same metal as the pixel electrodes (PE3 and PE4). The first electrode E1, the first dummy organic layer DMY_EL1, and the first dummy common electrode DMY_CE1 may have a configuration similar to the stackup configuration of the light emitting element ED. The second electrode E2, the second dummy organic layer DMY_EL2, and the second dummy common electrode DMY_CE2 may have a configuration similar to the stackup configuration of the light emitting element ED. However, since the first dummy common electrode DMY_CE1 and the second dummy common electrode DMY_CE2 are floating electrodes, undesired light emitting in the first touch sensor area TA1 and the second touch sensor area TA2 can be prevented or at least reduced.

As described above, the common electrode CE, the first dummy common electrode DMY_CE1, and the second dummy common electrode DMY_CE2 may be spaced apart and electrically separated from each other. To realize this configuration, for example, the display panel 110 may have a structure in which a portion or edge (e.g., a lower, upper, or side portion or edge) of at least one layer located under the common electrode CE is recessed. This structure may have an under-cut portion. Due to this structure, when the common electrode material is deposited, as the common electrode material is cut off at the under-cut portion, the common electrode CE, the first dummy common electrode DMY_CE1, and the second dummy common electrode DMY_CE2 can be formed separately.

For example, as shown in FIGS. 12A and 12B, the display panel 110 may have an under-cut portion in which a portion or edge (e.g., a lower, upper, or side portion or edge) of the lower insulating layer IND located under the overcoat layer OC is recessed inwardly.

Referring to FIGS. 12A and 12B, the lower insulating layer INS may include a first depression DEP1 recessed inwardly at the boundary between the pixel area PA and the first touch sensor area TA1, and a second depression DEP2 recessed inwardly at the boundary between the pixel area PA and the second touch sensor area TA2.

Referring to FIG. 12A, the common electrode CE and the first dummy common electrode DMY_CE1 may be spaced apart and electrically separated from each other at a location where the first depression DEP1 is located.

Referring to FIG. 12B, the common electrode CE and the second dummy common electrode DMY_CE2 may be spaced apart and electrically separated from each other at a location where the second depression DEP2 is located.

In one or more embodiments, the display panel 110 of the touch display device 100 according to aspects of the present disclosure may have a top emission structure in which light is emitted in a direction from the pixel electrodes PE3 and PE4 toward the common electrode CE.

Referring to FIG. 10, the first pixel electrode PE1 included in the first subpixel SP1 disposed in the pixel area PA may include a first upper pixel electrode PE1a and a first lower pixel electrode PE1b. The first upper pixel electrode PE1a and the first lower pixel electrode PE1b may be commonly connected to a second node N2 of a first driving transistor DRT in the first subpixel SP1, or only one of the first upper pixel electrode PE1a and the first lower pixel electrode PE1b may be connected to the second node N2 of the first driving transistor DRT in the first subpixel SP1.

The second pixel electrode PE2 included in the second subpixel SP2 disposed in the pixel area PA may include a second upper pixel electrode PE2a and a second lower pixel electrode PE2b. The second upper pixel electrode PE2a and the second lower pixel electrode PE2b may be commonly connected to a second node N2 of a second driving transistor DRT in the second subpixel SP2, or only one of the second upper pixel electrode PE2a and the second lower pixel electrode PE2b may be connected to the second node N2 of the second driving transistor DRT in the second subpixel SP2.

The third pixel electrode PE3 included in the third subpixel SP3 disposed in the pixel area PA may include a third upper pixel electrode PE3a and a third lower pixel electrode PE3b. The third upper pixel electrode PE3a and the third lower pixel electrode PE3b may be commonly connected to a second node N2 of a third driving transistor DRT in the third subpixel SP3, or only one of the third upper pixel electrode PE3a and the third lower pixel electrode PE3b may be connected to the second node N2 of the third driving transistor DRT in the third subpixel SP3.

The fourth pixel electrode PE4 included in the fourth subpixel SP4 disposed in the pixel area PA may include a fourth upper pixel electrode PE4a and a fourth lower pixel electrode PE4b. The fourth upper pixel electrode PE4a and the fourth lower pixel electrode PE4b may be commonly connected to a second node N2 of a fourth driving transistor DRT in the fourth subpixel SP4, or only one of the fourth upper pixel electrode PE4a and the fourth lower pixel electrode PE4b may be connected to the second node N2 of the fourth driving transistor DRT in the fourth subpixel SP4.

The reason why each of the first to fourth pixel electrodes (PE1 to PE4) includes two sub-electrodes is to perform a repair process during a manufacturing process. This will be briefly described based on the first pixel electrode PE1 as an example.

During the manufacturing process, when undesirable substances or particles are not generated in, or not introduced into, both the first upper pixel electrode PE1a and the first lower pixel electrode PE1b, and therefore, the repair process is not performed, the first upper pixel electrode PE1a and the first lower pixel electrode PE1b may be connected in common to the second node N2 of the first driving transistor DRT.

During the manufacturing process, when undesirable substances or particles are generated in, or introduced into, the first upper pixel electrode PE1a among the first upper pixel electrode PE1a and the first lower pixel electrode PE1b, a short circuit may be formed between the first upper pixel electrode PE1a and the common electrode CE. In this situation, an abnormal current may flow through the light emitting element ED, and thereby, the first subpixel SP1 may represent an abnormal bright spot.

Therefore, during the manufacturing process, when undesirable substances or particles are generated in, or introduced into, the first upper pixel electrode PE1a among the first upper pixel electrode PE1a and the first lower pixel electrode PE1b, a repair process can be performed by checking this situation.

During the repair process, a connection between the first upper pixel electrode PE1a and the second node N2 of the first driving transistor DRT may be disconnected through a cutting process. As a result, only the first lower pixel electrode PE1b among the first upper pixel electrode PE1a and the first lower pixel electrode PE1b may be connected to the second node N2 of one driving transistor DRT. Accordingly, only the first lower pixel electrode PE1b among the first upper pixel electrode PE1a and the first lower pixel electrode PE1b can receive a driving current from the first driving transistor DRT.

Due to the repair process, the first subpixel SP1 can normally perform light emitting even though undesirable substances or particles are generated in, or introduced into, the first upper pixel electrode PE1a.

Figure 13:
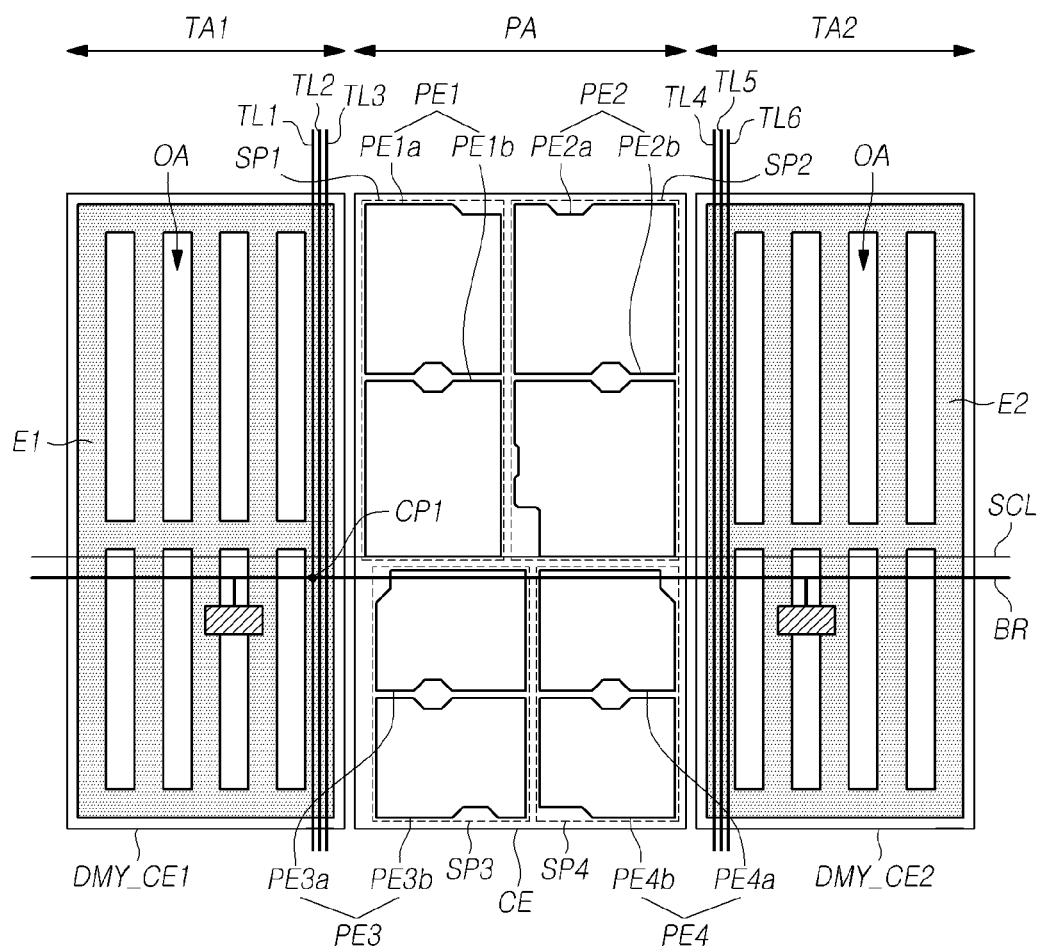
FIG. 13 is an example plan view of the display panel in which touch lines are disposed in the touch display device according to embodiments of the present disclosure.
Figure 14:
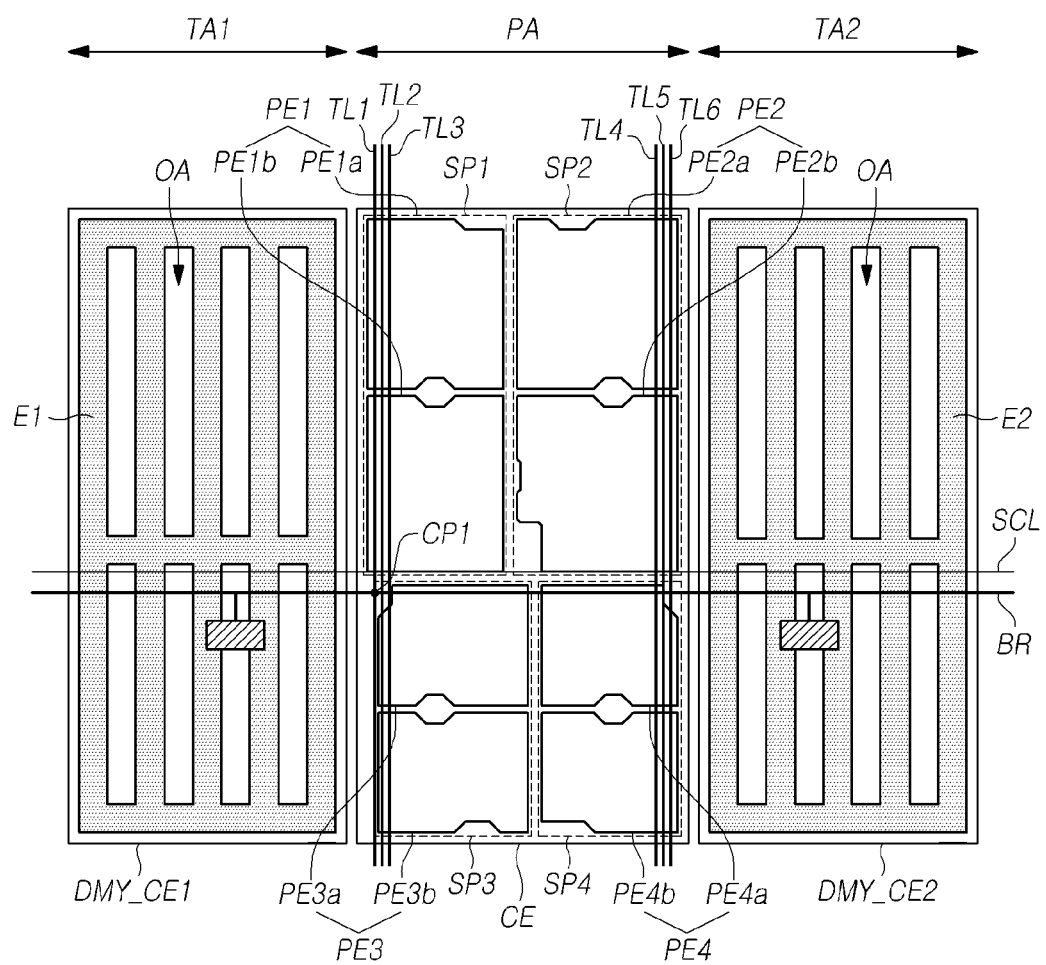
FIG. 14 is an example plan view of the display panel in which touch lines are disposed in the touch display device according to embodiments of the present disclosure.

FIG. 13 is an example plan view of the display panel 110 in which touch lines (TL1~TL6) are disposed in the touch display device 100 according to embodiments of the present disclosure. FIG. 14 is another example plan view of the display panel 110 in which touch lines (TL1~TL6) are disposed in the touch display device 100 according to embodiments of the present disclosure.

Except that the configurations of FIGS. 13 and 14 additionally include only the first to sixth touch lines TL compared to the configuration of FIG. 10, the remaining configurations of FIGS. 13 and 14 are the same or substantially the same as the configuration of FIG. 10. Therefore, hereinafter, discussions for the configurations of FIGS. 13 and 14 are provided by focusing on the first to sixth touch lines TL.

Referring to FIGS. 13 and 14, a plurality of touch electrodes TE disposed in the display panel 110 may include a first touch electrode TE.

Referring to FIGS. 13 and 14, the first touch electrode TE may include two or more electrodes electrically connected to each other. For example, the two or more electrodes included in the first touch electrode TE may include a first electrode E1 and a second electrode E2 electrically connected by a bridge BR.

A touch driving signal having a varying voltage level may be applied to the first touch electrode TE. Accordingly, the touch driving signal may be applied to the first electrode E1 and the second electrode E2, and to the bridge BR.

Referring to FIGS. 13 and 14, the plurality of touch lines TL disposed on the display panel 110 may include first to sixth touch lines (TL1 to TL6) corresponding to a first touch sensor TA1 and a second touch sensor area TA2. The configuration of the first to sixth touch lines (TL1 to TL6) corresponding to the first touch sensor area TA1 and the second touch sensor area TA2 in FIGS. 13 and 14 are merely illustrative. In one or more embodiments, the number of touch lines corresponding to the first touch sensor area TA1 and the second touch sensor area TA2 may be less than or greater than the first to sixth touch lines (TL1 to TL6).

For example, among the first to sixth touch lines (TL1 to TL6), the first to third touch lines (TL1 to TL3) may be disposed in the first touch sensor area TA1 as shown in FIG.

13, or be disposed adjacent to the first touch sensor area TA1 as shown in FIG. 14. Each of the first to third touch lines (TL1 to TL3) may be electrically connected to a corresponding one of electrodes disposed in the same column as the first electrode E1.

For example, among the first to sixth touch lines (TL1 to TL6), the fourth to sixth touch lines (TL4 to TL6) may be disposed in the second touch sensor area TA2 as shown in FIG. 13, or be disposed adjacent to the second touch sensor area TA2 as shown in FIG. 14. Each of the fourth to sixth touch lines (TL4 to TL6) may be electrically connected to a corresponding one of electrodes disposed in the same column as the second electrode E2.

Referring to FIGS. 13 and 14, among the first to sixth touch lines (TL1 to TL6), the first touch line TL1 may be electrically connected to the first touch electrode TE. The first touch electrode TE may be electrically connected to the touch driving circuit 160 through the first touch line TL1.

Referring to FIGS. 13 and 14, the first touch line TL1 may be electrically connected to at least one of the first electrode E1, the second electrode E2, and the bridge BR. For example, the first touch line TL1 may be electrically connected to the first electrode E1 through a first contact hole CP1. In another example, the first touch line TL1 may be electrically connected to the first electrode E1 or the bridge BR.

Meanwhile, as shown in FIG. 13, the first to sixth touch lines (TL1 to TL6) may be disposed in the touch sensor areas (TA1 and TA2). For example, the first to third touch lines (TL1 to TL3) may be disposed in the first touch sensor area TA1, and the fourth to sixth touch lines (TL4 to TL6) may be disposed in the second touch sensor area TA2.

Referring to FIG. 13, the first touch line TL1 electrically connected to the first electrode E1 and the second electrode E2 serving as the first touch electrode TE may intersect the bridge BR and be disposed in the first touch sensor area TA1. In one embodiment, the first touch line TL1 electrically connected to the first electrode E1 and the second electrode E2 serving as the first touch electrode TE may be disposed in the second touch sensor area TA2. In this embodiment, the first touch line TL1 may overlap a first dummy common electrode DMY_CE1 or a second dummy common electrode DMY_CE2.

In another embodiment, as shown in FIG. 14, the first to sixth touch lines (TL1 to TL6) may be disposed in the pixel area PA. In this embodiment, the first to third touch lines (TL1 to TL3) may be disposed to overlap first and third subpixels (SP1 and SP3) in the pixel area PA, and the fourth to sixth touch lines (TL4 to TL6) may be disposed to overlap second and fourth subpixels (SP2 and SP4) in the pixel area PA.

Referring to FIG. 14, for example, the first touch line TL1 electrically connected to the first electrode E1 and the second electrode E2 serving as the first touch electrode TE may be disposed in the pixel area PA without intersecting the bridge BR. In this example, the first touch line TL1 may overlap a common electrode CE.

Figure 15:
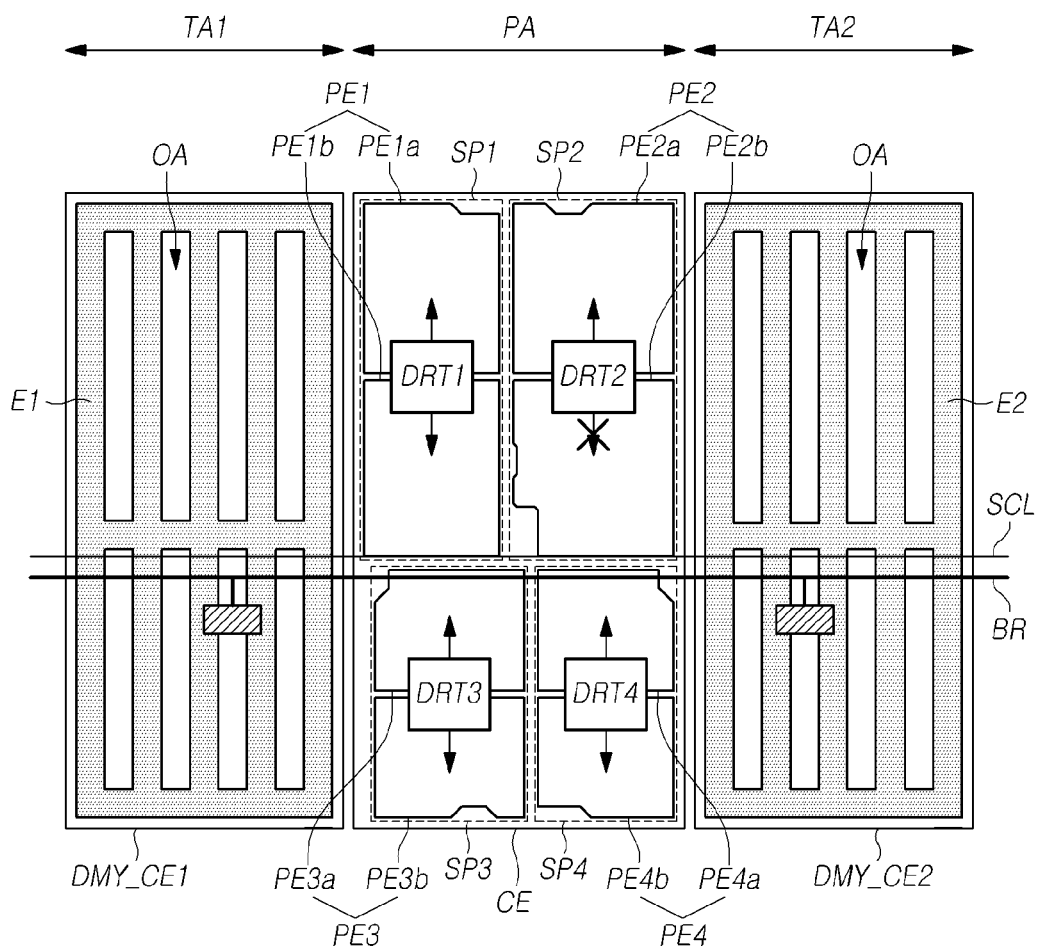
FIG. 15 is an example plan view of the display panel of the touch display device, and illustrates the display panel in which a repair process has been performed according to embodiments of the present disclosure.

FIG. 15 is an example plan view of the display panel 110 of the touch display device 100 according to aspects of the present disclosure, and illustrates the display panel 100 in which a repair process has been performed.

In one embodiment, in the display panel 110 of the touch display device 100, each of respective first to fourth pixel electrodes (PE1 to PE4) of first to fourth subpixels (SP1 to SP4) may have a single electrode form without being divided into two or more sub-electrodes.

In another embodiment, as shown in FIG. 15, in the display panel 110 of the touch display device 100, each of respective first to fourth pixel electrodes (PE1 to PE4) of first to fourth subpixels (SP1 to SP4) may have an electrode form in which each pixel electrode is divided into two or more sub-electrodes.

For example, as shown in FIG. 15, each of the first to fourth subpixels (SP1 to SP4) may be divided into two sub-electrodes.

Referring to FIG. 15, the first subpixel SP1 disposed in the pixel area PA may include the first pixel electrode PE1 including a first upper pixel electrode PE1a and a first lower pixel electrode PE1b, and a first driving transistor DRT1 for supplying a driving current to the first upper pixel electrode PE1a and the first lower pixel electrode PE1b. For example, a second node N2 of the first driving transistor DRT1 may be commonly connected to the first upper pixel electrode PE1a and the first lower pixel electrode PE1b.

Referring to FIG. 15, the second subpixel SP2 disposed in the pixel area PA may include the second pixel electrode PE2 including a second upper pixel electrode PE2a and a second lower pixel electrode PE2b, and a second driving transistor DRT2 for supplying a driving current to the second upper pixel electrode PE2a and the second lower pixel electrode PE2b. For example, a second node N2 of the second driving transistor DRT2 may be commonly connected to the second upper pixel electrode PE2a and the second lower pixel electrode PE2b.

Referring to FIG. 15, the third subpixel SP3 disposed in the pixel area PA may include the third pixel electrode PE3 including a third upper pixel electrode PE3a and a third lower pixel electrode PE3b, and a third driving transistor DRT3 for supplying a driving current to the third upper pixel electrode PE3a and the third lower pixel electrode PE3b. For example, a second node N2 of the third driving transistor DRT3 may be commonly connected to the third upper pixel electrode PE3a and the third lower pixel electrode PE3b.

Referring to FIG. 15, the fourth subpixel SP4 disposed in the pixel area PA may include the fourth pixel electrode PE4 including a fourth upper pixel electrode PE4a and a fourth lower pixel electrode PE4b, and a fourth driving transistor DRT4 for supplying a driving current to the fourth upper pixel electrode PE4a and the fourth lower pixel electrode PE4b. For example, a second node N2 of the fourth driving transistor DRT4 may be commonly connected to the fourth upper pixel electrode PE4a and the fourth lower pixel electrode PE4b.

Meanwhile, in the process of manufacturing the panel, a panel inspection process may be performed. During this process, when it is determined that a short circuit is formed between the pixel electrode and the common electrode CE due to the generation or introduction of undesirable substances or particles between the pixel electrode and the common electrode CE, a repair process may be performed. During the repair process, an electrical connection between one electrode related to such a short circuit among the upper and lower pixel electrodes resulting from the dividing of a corresponding pixel electrode and a second node N2 of a corresponding driving transistor may be disconnected through a laser cutting process or the like.

For example, when undesirable substances or particles are generated in, or introduced into, the area of the second subpixel SP2, in the second subpixel SP2 disposed in the pixel area PA, a connection portion between one electrode (the second upper pixel electrode PE2a or the second lower pixel electrode) where the undesirable substances or particles are generated in or introduced into among the second upper pixel electrode PE2a and the second lower pixel electrode and the second node N2 of the second driving transistor DRT2 may be cut off by such laser cutting.

Accordingly, the second driving transistor DRT2 can supply a driving current to only one of the second upper pixel electrode PE2a and the second lower pixel electrode PE2b.

In this example, the second node N2, which is the source or drain node of the second driving transistor DRT2, can be electrically connected to one of the second upper pixel electrode PE2a and the second lower pixel electrode PE2b, and be electrically separated from the other one.

Figure 16:
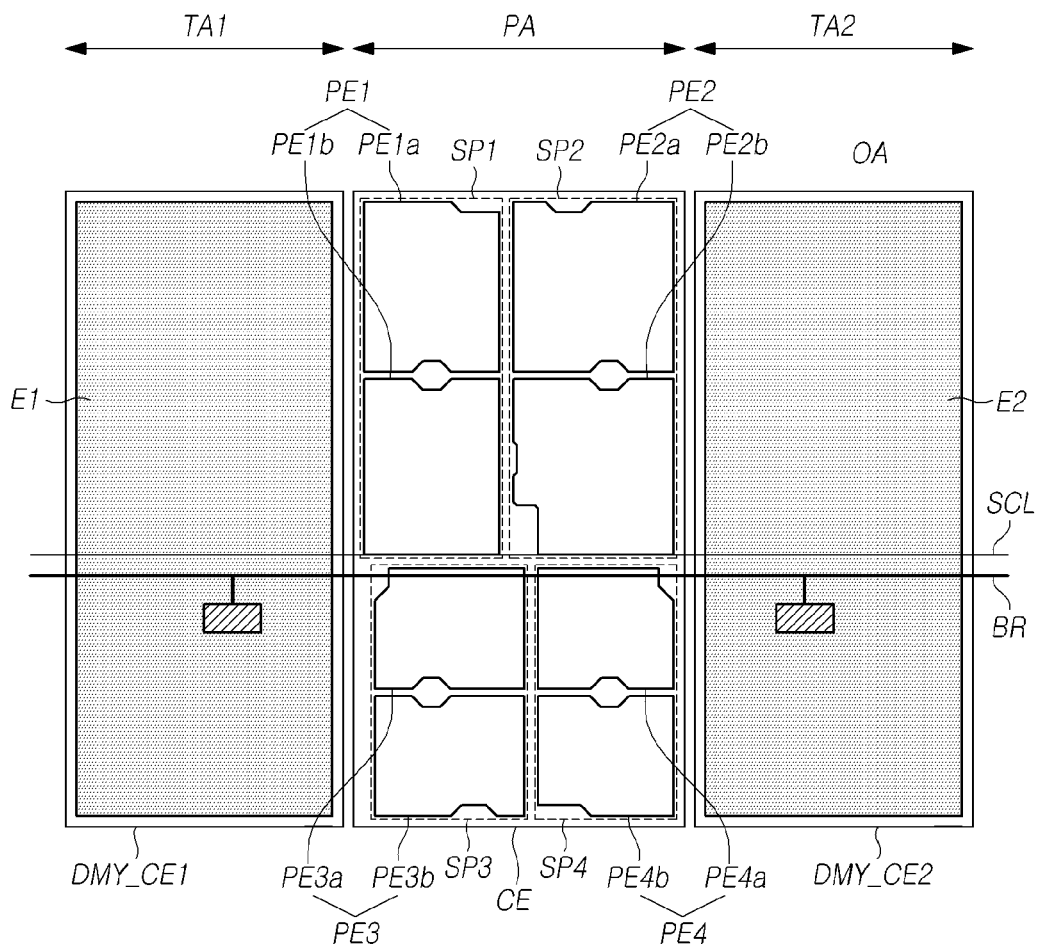
FIG. 16 is another example plan view of the display panel of the touch display device according to embodiments of the present disclosure.

FIG. 16 illustrates another example plan view of the display panel 110 of the touch display device 100 according to embodiments of the present disclosure.

Except that the configuration of FIG. 16 includes first and second electrodes (E1 and E2) configured in a different type from the first and second electrodes (E1 and E2) in the configuration of FIG. 10, the remaining configuration of FIG. 16 is the same or substantially the same as the remaining configuration of FIG. 10. Hereinafter, considering such a similarity, discussions related to the types of the first electrode E1 and the second electrode E2 will be provided with reference to FIGS. 10 and 16 together.

Referring to FIGS. 10 and 16, in one or more embodiments, the first touch sensor area TA1 and the second touch sensor area TA2 may be transmissive areas (or transparent areas).

For example, as shown in FIG. 10, each of the first electrode E1 and the second electrode E2 may include at least one opening OA (e.g., as being configured in a mesh type). According to this example, the transmittance (or transparency) of the first touch sensor area TA1 and the second touch sensor area TA2 can be improved.

When each of the first electrode E1 and the second electrode E2 is configured in a type having at least one opening OA (e.g., the mesh type), the first electrode E1 and the second electrode E2 may be transparent electrodes or opaque electrodes. For example, when the first electrode E1 and the second electrode E2 are opaque electrodes, the first electrode E1 and the second electrode E2 may be thin film electrodes having a predetermined thickness or less in order to improve transmittance (or transparency).

In another example, as shown in FIG. 16, each of the first electrode E1 and the second electrode E2 may be configured in a type without an opening OA (e.g., a plate type).

When each of the first electrode E1 and the second electrode E2 is configured in the type without an opening OA (e.g., the plate type), in order to increase transmittance (or transparency) of the first touch sensor area TA1 and the second touch sensor area TA2, the first electrode E1 and the second electrode E2 may be transparent electrodes, or opaque electrodes in the form of thin film having a predetermined thickness or less.

The embodiments described above will be briefly described as follows.

According to the embodiments described herein, the touch display device 100 can be provided that includes a substrate, a pixel area in which at least one subpixel is disposed, a first touch sensor area located on a first side of the pixel area, a second touch sensor area located on a second opposing side of the pixel area, and at least one pixel electrode disposed in the pixel area and including a first metal.

In one or more embodiments, the touch display device 100 may include a first electrode disposed in the first touch sensor area and including the first metal, and a second electrode disposed in the second touch sensor area and including the first metal.

In one or more embodiments, the touch display device 100 may further include abridge electrically interconnecting the first electrode and the second electrode.

In one or more embodiments, in the touch display device 100, the first touch sensor area and the second touch sensor area may be areas through which light can be transmitted.

The numbers of metal layers disposed in the first touch sensor area and the second touch sensor area may be less than the number of metal layers disposed in the pixel area.

The first metal may include a transparent electrode material or may be a metal having a predetermined thickness or less.

The bridge may include a first connector electrically connected to the first electrode and a second connector electrically connected to the second electrode.

The first connector may be located under the first electrode. The first connector may directly contact the rear surface of the first electrode.

The second connector may be located under the second electrode. The second connector may directly contact the rear surface of the second electrode.

The first connector may include a first connection line extending from the bridge and a first pad connected to the first electrode. The second connector may include a second connection line extending from the bridge and a second pad connected to the second electrode.

In one or more embodiments, the touch display device 100 may further include a lower insulating layer on a substrate, an overcoat layer located between the lower insulating layer and at least one pixel electrode in the pixel area, an organic layer disposed in the pixel area and located on the at least one pixel electrode, a first dummy organic layer disposed in the first touch sensor area and located on the first electrode, a second dummy organic layer disposed in the second touch sensor area and located on the second electrode, a common electrode on the organic layer, a first dummy common electrode on the first dummy organic layer, and a second dummy common electrode disposed in the second touch sensor area.

The common electrode and the first dummy common electrode may be spaced apart and electrically separated from each other, and the common electrode and the second dummy common electrode may be spaced apart and electrically separated from each other.

The lower insulating layer may include a first depression recessed inwardly at a boundary between the pixel area and the first touch sensor area, and a second depression recessed inwardly at a boundary between the pixel area and the second touch sensor area.

At a point where the first depression is located, the common electrode and the first dummy common electrode may be spaced apart and electrically separated from each other. At a point where the second depression is located, the common electrode and the second dummy common electrode may be spaced apart and electrically separated from each other.

A display common voltage may be applied to the common electrode, and the first dummy common electrode and the second dummy common electrode may be in an electrically floating state.

In one or more embodiments, the touch display device 100 may further include at least one touch electrode to which a touch driving signal having a varying voltage level is applied and at least one touch line electrically connected to the touch electrode.

The touch electrode may include a first electrode and a second electrode electrically connected by a bridge. The touch line may be electrically connected to at least one of the first electrode, the second electrode, and the bridge.

The touch line may intersect the bridge and overlap the common electrode.

The touch line may intersect the bridge and overlap the first dummy common electrode or the second dummy common electrode.

The first electrode may be a mesh-type electrode having at least one opening, and the second electrode may be the mesh-type electrode having at least one opening.

Four or more subpixels may be disposed in the pixel area.

In one or more embodiments, the touch display device 100 may include a first touch electrode and a first touch line electrically connected to each other.

The first touch electrode may include two or more electrodes electrically connected to each other, and the two or more electrodes may include the first electrode and the second electrode electrically connected by the bridge.

The touch line may be electrically connected to at least one of the first electrode, the second electrode, and the bridge.

For example, the touch line may intersect the bridge and be disposed in the pixel area.

In another example, the touch line may be disposed in the first touch sensor area or the second touch sensor area.

A first subpixel disposed in the pixel area may include a first pixel electrode including a first upper pixel electrode and a first lower pixel electrode, and a first driving transistor for supplying a driving current to the first upper pixel electrode and the first lower pixel electrode.

A second subpixel disposed in the pixel area may include a second pixel electrode including a second upper pixel electrode and a second lower pixel electrode, and a second driving transistor for supplying a driving current to only one of the second upper pixel electrode and the second lower pixel electrode.

The source or drain node of the second driving transistor may be electrically connected to one of the second upper pixel electrode and the second lower pixel electrode, and be electrically separated from the other one thereof.

According to the embodiments described herein, the touch display device 100 can be provided that includes a substrate, a pixel area in which at least one subpixel is disposed, a first touch sensor area located on a first side of the pixel area, at least one pixel electrode disposed in the pixel area, a first electrode disposed in the first touch sensor area, an organic layer disposed in the pixel area and located on the at least one pixel electrode, a first dummy organic layer disposed in the first touch sensor area and located on the first electrode, a common electrode disposed in the pixel area and located on the organic layer, and a first dummy common electrode disposed in the first touch sensor area, located on the first dummy organic layer, and being in an electrically floating state.

In one or more embodiments, in the touch display device 100, the first electrode may include a metal included in at least one pixel electrode.

In one or more embodiments, the touch display device 100 may further include a second touch sensor area located on a second opposing side of the pixel area, a second electrode disposed in a second touch sensor area, and a bridge for electrically interconnecting the first electrode and the second electrode.

The bridge may be disposed across the first touch sensor area, the pixel area, and the second touch sensor area.

The bridge may include a first connector electrically connected to the rear surface of the first electrode and a second connector electrically connected to the rear surface of the second electrode.

The first connector may directly contact the rear surface of the first electrode, and the second connector may directly contact the rear surface of the second electrode.

According to the embodiments described herein, the touch display device 100 may be provided that even when a touch sensor is embedded in a display panel, enables the thickness of the display panel to be reduced, and thereby, allows the weight of the display panel to be reduced.

According to the embodiments described herein, a touch sensor can be configured using a layer or material related to image displaying.

Accordingly, this implementation, since: a separate layer or material for the touch sensor is not required; the thickness of the display panel can be reduced; and a separate process for forming the touch sensor is not required, therefore, the touch display device 100 can provide effects of simplifying the manufacturing process thereof.

According to the embodiments described herein, the touch display device 100 may be provided that includes a structure in which a touch sensor is configured using a layer or material related to image displaying without a separate process for forming the touch sensor, and thereby, helps realize low manufacturing production energy and an optimized process (or optimized manufacturing process through such a simplified process.

According to the embodiments described herein, the touch display device 100 may be provided that has a structure allowing a touch sensor to be embedded and light to be transmitted.

The above description has been presented to enable any person skilled in the art to make, use and practice the technical features of the present invention, and has been provided in the context of a particular application and its requirements as examples. Various modifications, additions and substitutions to the described embodiments will be readily apparent to those skilled in the art, and the principles described herein may be applied to other embodiments and applications without departing from the scope of the present invention. The above description and the accompanying drawings provide examples of the technical features of the present invention for illustrative purposes only. That is, the disclosed embodiments are intended to illustrate the scope of the technical features of the present invention.

What is claimed is:

1. A touch display device comprising:
a substrate;
a pixel area in which at least one subpixel is disposed;
a first touch sensor area on a first side of the pixel area;
a second touch sensor area on a second opposing side of the pixel area;
at least one pixel electrode in the pixel area, the at least one pixel electrode including a first metal;
a first electrode in the first touch sensor area;
a second electrode in the second touch sensor area; and
a bridge electrically interconnecting the first electrode and the second electrode,
wherein respective numbers of metal layers in the first touch sensor area and the second touch sensor area are less than a number of metal layers in the pixel area, and the first touch sensor area and the second touch sensor area are included in an area through which external light is transmitted.

2. The touch display device of claim 1, wherein the first metal comprises a transparent electrode material or a metal having a predetermined thickness or less.

3. The touch display device of claim 1, wherein the bridge comprises a first connector electrically connected to the first electrode and a second connector electrically connected to the second electrode, and
wherein the first connector is located under the first electrode, and the second connector is located under the second electrode.

4. The touch display device of claim 3, wherein the first connector directly contacts a rear surface of the first electrode, and the second connector directly contacts a rear surface of the second electrode.

5. The touch display device of claim 3, wherein the first connector comprises a first connection line extending from the bridge and a first pad connected to the first electrode, and the second connector comprises a second connection line extending from the bridge and a second pad connected to the second electrode.

6. The touch display device of claim 1, further comprising:
a lower insulating layer on the substrate;
an overcoat layer between the lower insulating layer and the at least one pixel electrode in the pixel area;
an organic layer in the pixel area, the organic layer on the at least one pixel electrode;
a first dummy organic layer in the first touch sensor area, the first dummy organic layer on the first electrode;
a second dummy organic layer in the second touch sensor area, the second dummy organic layer on the second electrode;
a common electrode on the organic layer;
a first dummy common electrode on the first dummy organic layer; and
a second dummy common electrode in the second touch sensor area,
wherein the common electrode and the first dummy common electrode are spaced apart and electrically separated from each other, and the common electrode and the second dummy common electrode are spaced apart and electrically separated from each other.

7. The touch display device of claim 6, wherein the lower insulating layer comprises a first depression recessed inwardly at a boundary between the pixel area and the first touch sensor area, and a second depression recessed inwardly at a boundary between the pixel area and the second touch sensor area, and
wherein at a point where the first depression is located, the common electrode and the first dummy common electrode are spaced apart and electrically separated from each other, and at a point where the second depression is located, the common electrode and the second dummy common electrode are spaced apart and electrically separated from each other.

8. The touch display device of claim 6, wherein a display common voltage is applied to the common electrode, and the first dummy common electrode and the second dummy common electrode are in an electrically floating state.

9. The touch display device of claim 6, further comprising:
a touch electrode to which a touch driving signal having a varying voltage level is applied; and
a touch line electrically connected to the touch electrode,
wherein the touch electrode comprises the first electrode and the second electrode electrically connected by the bridge, and the touch line is electrically connected to at least one of the first electrode, the second electrode, or the bridge.

10. The touch display device of claim 9, wherein the touch line intersects the bridge, and overlaps the common electrode.

11. The touch display device of claim 9, wherein the touch line intersects the bridge, and overlaps the first dummy common electrode or the second dummy common electrode.

12. The touch display device of claim 1, wherein the first electrode is a mesh-type electrode having at least one opening, and the second electrode is the mesh-type electrode having at least one opening.

13. The touch display device of claim 1, wherein four or more subpixels are in the pixel area.

14. A touch display device comprising:
a substrate;
a pixel area in which at least one subpixel is disposed;
a first touch sensor area on a first side of the pixel area;
a second touch sensor area on a second opposing side of the pixel area;
at least one pixel electrode in the pixel area, the at least one pixel electrode including a first metal;
a first electrode in the first touch sensor area;
a second electrode in the second touch sensor area; and
a bridge electrically interconnecting the first electrode and the second electrode,
a first touch electrode and a first touch line electrically connected to each other,
wherein the first touch electrode comprises two or more electrodes electrically connected to each other, and the two or more electrodes comprises the first electrode and the second electrode electrically connected by the bridge, and
wherein the first touch line is electrically connected to at least one of the first electrode, the second electrode, and the bridge.

15. The touch display device of claim 14, wherein the first touch line intersects the bridge, and is in the pixel area.

16. The touch display device of claim 14, wherein the first touch line intersects the bridge, and is in the first touch sensor area or the second touch sensor area.

17. The touch display device of claim 1, wherein a first subpixel in the pixel area comprises:
a first pixel electrode including a first upper pixel electrode and a first lower pixel electrode; and
a first driving transistor configured to supply a driving current to the first upper pixel electrode and the first lower pixel electrode.

18. The touch display device of claim 1, wherein a second subpixel in the pixel area comprises:
a second pixel electrode including a second upper pixel electrode and a second lower pixel electrode; and
a second driving transistor configured to supply a driving current to the second upper pixel electrode and the second lower pixel electrode.

19. The touch display device of claim 18, wherein a source node or a drain node of the second driving transistor is electrically connected to one of the second upper pixel electrode or the second lower pixel electrode, and is electrically separated from the other one thereof.

20. A touch display device comprising:
a substrate;
a pixel area in which at least one subpixel is disposed;

a first touch sensor area on a first side of the pixel area;
at least one pixel electrode in the pixel area;
a first electrode in the first touch sensor area;
an organic layer in the pixel area, the organic layer located on the at least one pixel electrode;
a first dummy organic layer in the first touch sensor area, the first dummy organic layer located on the first electrode;
a common electrode in the pixel area, the common electrode located on the organic layer; and
a first dummy common electrode in the first touch sensor area, the first dummy common electrode on the first dummy organic layer, and in an electrically floating state,
wherein the first electrode comprises a metal included in the at least one pixel electrode.

21. The touch display device of claim 20, further comprising:

a second touch sensor area on a second opposing side of the pixel area;
a second electrode in the second touch sensor area; and
a bridge electrically interconnecting the first electrode and the second electrode.

22. The touch display device of claim 21, wherein the bridge is disposed across the first touch sensor area, the pixel area, and the second touch sensor area.

23. The touch display device of claim 21, wherein the bridge comprises a first connector electrically connected to a rear surface of the first electrode and a second connector electrically connected to a rear surface of the second electrode.

24. The touch display device of claim 23, wherein the first connector directly contacts the rear surface of the first electrode, and the second connector directly contacts the rear surface of the second electrode.

* * * * *